US008404523B2

(12) United States Patent
Hembree et al.

(10) Patent No.: US 8,404,523 B2
(45) Date of Patent: Mar. 26, 2013

(54) METHOD FOR FABRICATING STACKED SEMICONDUCTOR SYSTEM WITH ENCAPSULATED THROUGH WIRE INTERCONNECTS (TWI)

(75) Inventors: David R. Hembree, Boise, ID (US); Alan G. Wood, Boise, ID (US)

(73) Assignee: Micron Technoloy, Inc., Boise, ID (US)

( * ) Notice: Subject to any disclaimer, the term of this patent is extended or adjusted under 35 U.S.C. 154(b) by 0 days.

(21) Appl. No.: 13/534,038

(22) Filed: Jun. 27, 2012

(65) Prior Publication Data

US 2012/0288997 A1 Nov. 15, 2012

Related U.S. Application Data

(63) Continuation of application No. 13/285,490, filed on Oct. 31, 2011, now Pat. No. 8,217,510.

(51) Int. Cl.
*H01L 23/04* (2006.01)
(52) U.S. Cl. ........ 438/117; 257/698; 257/221; 257/224; 257/787; 257/796; 257/733; 257/E21.575; 257/E21.641
(58) Field of Classification Search .................. 438/117; 257/698, 221, 224, 787, 796, 678, 733, E21.575, 257/E21.597, E21.641
See application file for complete search history.

(56) References Cited

U.S. PATENT DOCUMENTS

| 3,761,782 | A | 9/1973 | Youmans |
| 4,348,253 | A | 9/1982 | Subbarao et al. |
| 4,394,712 | A | 7/1983 | Anthony |
| 4,710,795 | A | 12/1987 | Nippert et al. |
| 4,807,021 | A | 2/1989 | Okumura |
| 4,808,273 | A | 2/1989 | Hua et al. |
| 4,897,708 | A | 1/1990 | Clements |
| 5,229,647 | A | 7/1993 | Gnadinger |
| 5,432,999 | A | 7/1995 | Capps et al. |
| 5,483,741 | A | 1/1996 | Akram et al. |
| 5,495,667 | A | 3/1996 | Farnworth et al. |
| 5,496,775 | A | 3/1996 | Brooks |
| 5,503,285 | A | 4/1996 | Warren |
| 5,519,332 | A | 5/1996 | Wood |
| 5,649,981 | A | 7/1997 | Arnold et al. |

(Continued)

FOREIGN PATENT DOCUMENTS

| EP | 1662566 A2 | 5/2006 |
| JP | 01-310589 | 12/1989 |

(Continued)

OTHER PUBLICATIONS

Ivy Wei Qin, PhD et al., "Automatic Wedge Bonding with Ribbon Wire for High Frequency Applications", Kulicke & Soffa, 2002 SEMICON® West 2002 SEMI® Technology Symposium: International Electronics Manufacturing Technology (IEMT) Symposium, pp. 1-11.

(Continued)

*Primary Examiner* — Marc Armand
(74) *Attorney, Agent, or Firm* — Stephen A. Gratton

(57) ABSTRACT

A method for fabricating a stacked semiconductor system with encapsulated through wire interconnects includes providing a substrate having a first side, a second side and a substrate contact; forming a via in the substrate contact and the substrate to the second side; placing a wire in the via; forming a first contact on the wire proximate to the first side and a second contact on the wire proximate to the second side; and forming a polymer layer on the first side leaving the first contact exposed. The method also includes stacking two or more substrates and electrically connecting the through wire interconnects on the substrates.

20 Claims, 17 Drawing Sheets

U.S. PATENT DOCUMENTS

| | | | |
|---|---|---|---|
| 5,674,785 A | 10/1997 | Akram et al. |
| 5,686,352 A | 11/1997 | Higgins, III |
| 5,739,585 A | 4/1998 | Akram et al. |
| 5,793,103 A | 8/1998 | Daubenspeck et al. |
| 5,814,889 A | 9/1998 | Gaul |
| 5,824,569 A | 10/1998 | Brook et al. |
| 5,840,199 A | 11/1998 | Warren |
| 5,852,871 A | 12/1998 | Khandros |
| 5,866,949 A | 2/1999 | Schueller |
| 5,894,983 A | 4/1999 | Beck et al. |
| 5,931,685 A | 8/1999 | Hembree et al. |
| 5,950,070 A | 9/1999 | Razon et al. |
| 5,990,546 A | 11/1999 | Igarashi et al. |
| 6,002,177 A | 12/1999 | Gaynes et al. |
| 6,033,614 A | 3/2000 | Bolken et al. |
| 6,040,702 A | 3/2000 | Hembree et al. |
| 6,043,564 A | 3/2000 | Brooks et al. |
| 6,100,175 A | 8/2000 | Wood et al. |
| 6,107,109 A | 8/2000 | Akram et al. |
| 6,114,240 A | 9/2000 | Akram et al. |
| 6,184,587 B1 | 2/2001 | Khandros et al. |
| 6,187,678 B1 | 2/2001 | Gaynes et al. |
| 6,222,276 B1 | 4/2001 | Bertin et al. |
| 6,235,554 B1 | 5/2001 | Akram et al. |
| 6,236,115 B1 | 5/2001 | Gaynes et al. |
| 6,251,703 B1 | 6/2001 | VanCampenhout et al. |
| 6,252,298 B1 | 6/2001 | Lee et al. |
| 6,253,992 B1 | 7/2001 | Fjelstad |
| 6,294,837 B1 | 9/2001 | Akram et al. |
| 6,316,287 B1 | 11/2001 | Zandman et al. |
| 6,326,689 B1 | 12/2001 | Thomas |
| 6,332,569 B1 | 12/2001 | Cordes et al. |
| 6,336,269 B1 | 1/2002 | Eldridge et al. |
| 6,339,260 B1 | 1/2002 | Kwon |
| 6,368,896 B2 | 4/2002 | Farnworth et al. |
| 6,380,555 B1 | 4/2002 | Hembree et al. |
| 6,395,581 B1 | 5/2002 | Choi |
| 6,400,172 B1 | 6/2002 | Akram et al. |
| 6,435,200 B1 | 8/2002 | Langen |
| 6,437,254 B1 * | 8/2002 | Crudo et al. ............ 174/267 |
| 6,444,576 B1 | 9/2002 | Kong |
| 6,451,624 B1 | 9/2002 | Farnworth et al. |
| 6,465,877 B1 | 10/2002 | Farnworth et al. |
| 6,485,814 B1 | 11/2002 | Morlizuni et al. |
| 6,494,221 B1 | 12/2002 | Sellmer et al. |
| 6,498,074 B2 | 12/2002 | Siniaguine et al. |
| 6,501,165 B1 | 12/2002 | Farnworth et al. |
| 6,528,984 B2 | 3/2003 | Beaman et al. |
| 6,566,747 B2 | 5/2003 | Ohuchi et al. |
| 6,569,762 B2 | 5/2003 | Kong |
| 6,577,013 B1 | 6/2003 | Glenn et al. |
| 6,582,992 B2 | 6/2003 | Poo et al. |
| 6,600,221 B2 | 7/2003 | Kimura |
| 6,601,888 B2 | 8/2003 | McIlwraith et al. |
| 6,605,551 B2 | 8/2003 | Wermer et al. |
| 6,608,371 B2 | 8/2003 | Kurashima et al. |
| 6,611,052 B2 | 8/2003 | Poo et al. |
| 6,614,104 B2 | 9/2003 | Farnworth et al. |
| 6,620,633 B2 | 9/2003 | Hembree et al. |
| 6,620,731 B1 | 9/2003 | Farnworth et al. |
| 6,638,847 B1 | 10/2003 | Cheung et al. |
| 6,653,170 B1 | 11/2003 | Lin |
| 6,680,213 B2 | 1/2004 | Farnworth et al. |
| 6,712,261 B2 | 3/2004 | Hall et al. |
| 6,717,245 B1 | 4/2004 | Kinsman et al. |
| 6,720,661 B2 | 4/2004 | Hanaoka et al. |
| 6,724,074 B2 | 4/2004 | Song et al. |
| 6,727,116 B2 | 4/2004 | Poo et al. |
| 6,731,013 B2 | 5/2004 | Juso et al. |
| 6,740,582 B2 | 5/2004 | Siniaguine |
| 6,740,960 B1 | 5/2004 | Farnworth et al. |
| 6,740,982 B2 | 5/2004 | Sauter et al. |
| 6,803,303 B1 | 10/2004 | Hiatt et al. |
| 6,812,549 B2 | 11/2004 | Umetsu et al. |
| 6,828,175 B2 | 12/2004 | Wood et al. |
| 6,831,367 B2 | 12/2004 | Sekine |
| 6,833,317 B2 | 12/2004 | Forbes et al. |
| 6,833,612 B2 | 12/2004 | Kinsman |
| 6,833,613 B1 | 12/2004 | Akram et al. |
| 6,841,883 B1 | 1/2005 | Farnworth et al. |
| 6,846,725 B2 | 1/2005 | Nagarajan et al. |
| 6,848,177 B2 | 2/2005 | Swan et al. |
| 6,858,092 B2 | 2/2005 | Langen |
| 6,881,648 B2 | 4/2005 | Chen et al. |
| 6,882,057 B2 | 4/2005 | Hsu |
| 6,896,170 B2 | 5/2005 | Lyn et al. |
| 6,903,442 B2 | 6/2005 | Farnwoth et al. |
| 6,903,443 B2 | 6/2005 | Farnworth et al. |
| 6,906,418 B2 | 6/2005 | Hiatt |
| 6,908,784 B1 | 6/2005 | Farnworth et al. |
| 6,933,524 B2 | 8/2005 | Hembree et al. |
| 6,936,913 B2 | 8/2005 | Akerling et al. |
| 6,952,054 B2 | 10/2005 | Akram et al. |
| 6,954,000 B2 | 10/2005 | Hembree et al. |
| 6,964,915 B2 | 11/2005 | Farnworth et al. |
| 6,998,344 B2 | 2/2006 | Akram et al. |
| 6,998,717 B2 | 2/2006 | Farnworth et al. |
| 7,029,949 B2 | 4/2006 | Farnworth et al. |
| 7,060,526 B2 | 6/2006 | Farnworth et al. |
| 7,078,266 B2 | 7/2006 | Wood et al. |
| 7,078,922 B2 | 7/2006 | Kirby |
| 7,081,665 B2 | 7/2006 | Wood et al. |
| 7,108,546 B2 * | 9/2006 | Miller et al. ............ 439/578 |
| 7,112,469 B2 | 9/2006 | Mihara |
| 7,119,001 B2 | 10/2006 | Kang |
| 7,132,731 B2 | 11/2006 | Wood et al. |
| 7,132,741 B1 | 11/2006 | Lin et al. |
| 7,180,149 B2 | 2/2007 | Yamamoto et al. |
| 7,307,348 B2 | 12/2007 | Wood et al. |
| 7,312,521 B2 | 12/2007 | Noma et al. |
| 7,314,821 B2 | 1/2008 | Kirby et al. |
| 7,371,676 B2 | 5/2008 | Hembree |
| 7,371,693 B2 | 5/2008 | Suzuki et al. |
| 7,393,770 B2 | 7/2008 | Wood et al. |
| 7,417,314 B1 | 8/2008 | Lin et al. |
| 7,498,647 B2 | 3/2009 | Kirby et al. |
| 7,579,267 B2 | 8/2009 | Wood et al. |
| 7,595,222 B2 | 9/2009 | Shimoishizaka et al. |
| 7,659,612 B2 | 2/2010 | Hembree et al. |
| 7,682,962 B2 | 3/2010 | Hembree et al. |
| 7,727,872 B2 | 6/2010 | Wood et al. |
| 7,728,443 B2 | 6/2010 | Hembree |
| 7,757,385 B2 | 7/2010 | Hembree |
| 7,768,096 B2 | 8/2010 | Wood et al. |
| 7,786,605 B2 | 8/2010 | Wood et al. |
| 7,883,908 B2 | 2/2011 | Hembree et al. |
| 7,919,846 B2 | 4/2011 | Hembree |
| 7,935,991 B2 | 5/2011 | Wood et al. |
| 7,951,702 B2 | 5/2011 | Wood et al. |
| 8,053,909 B2 | 11/2011 | Hembree |
| 8,120,167 B2 | 2/2012 | Hembree |
| 8,193,646 B2 | 6/2012 | Wood et al. |
| 8,217,510 B2 | 7/2012 | Hembree et al. |
| 2001/0052536 A1 | 12/2001 | Scherdorf et al. |
| 2002/0017710 A1 * | 2/2002 | Kurashima et al. ......... 257/686 |
| 2002/0063311 A1 | 5/2002 | Siniaguine |
| 2002/0094601 A1 | 7/2002 | Su et al. |
| 2002/0117330 A1 | 8/2002 | Eldridge et al. |
| 2003/0049925 A1 | 3/2003 | Layman |
| 2003/0082851 A1 | 5/2003 | Van Hoff |
| 2003/0082915 A1 | 5/2003 | Iwasaki et al. |
| 2003/0230805 A1 | 12/2003 | Noma et al. |
| 2003/0232460 A1 | 12/2003 | Poo et al. |
| 2004/0005770 A1 | 1/2004 | Farnworth et al. |
| 2004/0080040 A1 | 4/2004 | Dotta et al. |
| 2004/0229405 A1 | 11/2004 | Prabhu |
| 2004/0235270 A1 | 11/2004 | Noma et al. |
| 2004/0238955 A1 | 12/2004 | Homma et al. |
| 2004/0256734 A1 | 12/2004 | Farnworth et al. |
| 2005/0017333 A1 | 1/2005 | Bohr |
| 2005/0029650 A1 | 2/2005 | Wood et al. |
| 2005/0056682 A1 | 3/2005 | Cobbley et al. |
| 2005/0082654 A1 | 4/2005 | Humpston et al. |
| 2005/0161833 A1 | 7/2005 | Takeuchi et al. |
| 2005/0167812 A1 | 8/2005 | Yoshida et al. |
| 2005/0176235 A1 | 8/2005 | Noma et al. |
| 2005/0202651 A1 | 9/2005 | Akram |

| | | | |
|---|---|---|---|
| 2005/0205951 A1 | 9/2005 | Eskridge | |
| 2005/0263571 A1 | 12/2005 | Belanger et al. | |
| 2006/0017177 A1 | 1/2006 | Seng et al. | |
| 2006/0022328 A1 | 2/2006 | Lee | |
| 2006/0057775 A1 | 3/2006 | Shao et al. | |
| 2006/0108665 A1 | 5/2006 | Kurokawa et al. | |
| 2006/0108666 A1 | 5/2006 | Koizumi | |
| 2006/0163679 A1 | 7/2006 | LaFond et al. | |
| 2006/0170076 A1 | 8/2006 | Sato | |
| 2006/0170110 A1 | 8/2006 | Akram et al. | |
| 2006/0228825 A1 | 10/2006 | Hembree | |
| 2006/0261446 A1 | 11/2006 | Wood et al. | |
| 2006/0289992 A1 | 12/2006 | Wood | |
| 2007/0126091 A1 | 6/2007 | Wood et al. | |
| 2007/0138498 A1 | 6/2007 | Ziber et al. | |
| 2007/0167000 A1 | 7/2007 | Wood et al. | |
| 2007/0200255 A1 | 8/2007 | Hembree | |
| 2007/0202617 A1 | 8/2007 | Hembree | |
| 2007/0222054 A1 | 9/2007 | Hembree | |
| 2007/0238955 A1 | 10/2007 | Tearney | |
| 2007/0246819 A1 | 10/2007 | Hembree | |
| 2008/0038868 A1 | 2/2008 | Leib | |
| 2008/0042247 A1 | 2/2008 | Wood et al. | |
| 2008/0203539 A1 | 8/2008 | Wood et al. | |
| 2008/0206990 A1 | 8/2008 | Wood et al. | |
| 2008/0229573 A1 | 9/2008 | Wood et al. | |
| 2009/0212407 A1 | 8/2009 | Foster et al. | |
| 2010/0047934 A1 | 2/2010 | Hembree et al. | |
| 2010/0140753 A1 | 6/2010 | Hembree | |
| 2010/0144139 A1 | 6/2010 | Wood et al. | |
| 2010/0264521 A1 | 10/2010 | Wood et al. | |
| 2011/0024745 A1 | 2/2011 | Hembree | |
| 2011/0108959 A1 | 5/2011 | Hembree | |
| 2011/0175223 A1 | 7/2011 | Wood | |
| 2012/0043670 A1 | 2/2012 | Wood et al. | |

FOREIGN PATENT DOCUMENTS

| | | |
|---|---|---|
| JP | 08-213427 | 8/1996 |
| JP | 09-306955 | 11/1997 |
| JP | 11-274354 | 10/1999 |
| JP | 2000-299334 | 10/2000 |
| JP | 2001-044357 | 2/2001 |
| JP | 2001-068618 | 3/2001 |
| JP | 2001-077250 | 3/2001 |
| JP | 2001-135785 | 5/2001 |
| JP | 2001-308122 | 11/2001 |
| JP | 2002 107382 | 4/2002 |
| JP | 2003-108963 | 4/2003 |
| JP | 2006-074736 | 3/2006 |
| JP | 2006156436 A | 6/2006 |
| JP | 2006-253330 | 9/2006 |
| TW | 516194 | 1/2003 |
| TW | 57420 | 1/2004 |
| WO | WO 91/00619 | 1/1991 |
| WO | WO 9901776 | 1/1999 |

OTHER PUBLICATIONS

International Technology Roadmap for Semiconductors, 2005 Edition, Assembly and Packaging, pp. 1-50.
Dr. Ning-Cheng Lee, "The Use of Solder as an Area-Array Package Interconnect", Chip Scale Review, Sep.-Oct. 1999, pp. 1-8. Available on line: www:chipscalereview.com/issues/.
Indium Corporation of America, Product Data sheet, "Pb-Free Solder Fabrication", pp. 1-2, date unavailable.
Kulicke & Soffa, Dispense/UV/ Cure Kit for NOSWEEP™, advertising, Mar. 15, 2005, pp. 1-2. Available on line:www.kns.com.
George A. Riley, PhD., FLIPCHIPS dot.com. Tutorial 37, "Too much gold can be a bad thing", Mar. 24, 2005, pp. 1-3. Available on line: www.flip[chips.com/tutorial37.html.
Leon Oboler, "Still at the Head of the Class", Chip Scale Review, internet article, Jul./Aug. 1999, pp. 1-7.
btechcorp, High Thermally and Electrically Conductive Z-Axis Film Adhesives, spec sheet, Mar. 22, 2006, pp. 1-2.
Boschman web site, "Film Assisted Molding: Encapsulation processes for advanced and standard packages", date unavailable, pp. 1-3.
IBM Research & IBM Systems and Technology Group, C4NP Technology for lead-free wafer bumping, internet article, Sep. 2004, pp. 1-13.
IBM and SUSS announce semiconductor technology agreement, internet article, Sep. 13, 2004, pp. 1-2.
Office Action dated Oct. 17, 2007 from U.S. Appl. No. 11/102,408 (US Patent No. 7,371,676), pp. 1-9.
Office Action dated Jul. 11, 2007 from U.S. Appl. No. 11/102,408 (US Patent No. 7,371,676). pp. 1-8.
Notice of Allowance dated Jan. 7, 2008 from U.S. Appl. No. 11/102,408 (US Patent No. 7,371,676), pp. 1-9.
Office Action dated Nov. 14, 2008 from U.S. Appl. No. 11/712,815 (US Patent No. 7,579,267), pp. 1-5.
Office Action dated Oct. 31, 2007 from U.S. Appl. No. 11/133,085 (US Patent No. 7,393,770), pp. 1-13.
Office Action dated Feb. 11, 2008 from U.S. Appl. No. 11/133,085 (US Patent No. 7,393,770), pp. 1-10.
Notice of Allowance dated Mar. 5, 2008 from U.S. Appl. No. 11/133,085 (US Patent No. 7,393,770), pp. 1-8.
Office Action dated Mar. 12, 2009 from U.S. Appl. No. 11/409,638, pp. 1-18.
Office Action dated Jul. 13, 2009 from U.S. Appl. No. 11/409,638, pp. 1-17.
Notice of Allowance dated Sep. 28, 2009 from U.S. Appl. No. 11/409,638, pp. 1-8.
Office Action dated Jun. 4, 2007 from U.S. Appl. No. 11/296,057 (US Patent No. 7,307,348, pp. 1-9.
Notice of Allowance dated Aug. 3, 2007 from U.S. Appl. No. 11/296,057 (US Patent No. 7,307,348), pp. 1-6.
Office Action from U.S. Appl. No. 11/743,636 dated Aug. 3, 2009, pp. 1-10.
Notice of Allowance from U.S. Appl. No. 11/743,636 dated Nov. 17, 2009 (US Patent No. 7,682,962), pp. 1-9.
Office Action from U.S. Appl. No. 11/743,660 dated Aug. 4, 2009, pp. 1-11.
Office Action dated Dec. 29, 2009 from U.S. Appl. No. 11/743,660, pp. 1-10.
Notice of Allowance from U.S. Appl. No. 11/743,660 dated Jan. 26, 2010, pp. 1-6.
Office Action from U.S. Appl. No. 12/114,761 dated Oct. 7, 2009, pp. 1-11.
Office Action from U.S. Appl. No. 12/114,761 dated Feb. 24, 2010, pp. 1-11.
Notice of Allowance from U.S. Appl. No. 12/114,761 dated Apr. 9, 2010, pp. 1-7.
Office Action from U.S. Appl. No. 11/743,689 dated Nov. 30, 2009 pp. 1-8.
Notice of Allowance from U.S. Appl. No. 11/743,689 dated Mar. 22, 2010, pp. 1-7.
Office Action from U.S. Appl. No. 12/117,919 dated Oct. 5, 2009, pp. 1-10.
Notice of Allowance from U.S. Appl. No. 12/117,919 dated Jan. 26, 2010, pp. 1-7.
Notice of Allowance from U.S. Appl. No. 11/859,776 dated Apr. 30, 2010, pp. 1-7.
Office Action from U.S. Appl. No. 11/859,776 dated Feb. 19, 2010, pp. 1-10.
Notice of Allowance from U.S. Appl. No. 12/581,255 dated Sep. 29, 2010, pp. 1-17.
Office Action from U.S. Appl. No. 12/703,551 dated Oct. 5, 2010, pp. 1-10.
Notice of Allowance from U.S. Appl. No. 12/703,551 dated Dec. 10, 2010, pp. 1-10.
Office Action from U.S. Appl. No. 12/114,757 dated Sep. 17, 2010, pp. 1-28.
Office Action from U.S. Appl. No. 12/114,757 dated Dec. 14, 2010, pp. 1-11.
Notice of Allowance from U.S. Appl. No. 12/114,757 dated Jan. 5, 2011, pp. 1-7.
Office Action from U.S. Appl. No. 12/703,520 dated Jul. 9, 2010, pp. 1-13.
Office Action from U.S. Appl. No. 12/703,520 dated Nov. 12, 2010, pp. 1-14.

Notice of Allowance from U.S. Appl. No. 12/703,520 dated May 2, 2011, pp. 1-10.
Office Action from U.S. Appl. No. 13/007,743 dated May 25, 2011, pp. 1-20.
Office Action from U.S. Appl. No. 12/904,314 dated Jul. 5, 2011, pp. 1-17.
Notice of Allowance from U.S. Appl. No. 12/904,314 dated Jul. 21, 2011, pp. 1-7.
Office Action from U.S. Appl. No. 12/824,487 dated Dec. 1, 2011, pp. 1-7.
Notice of Allowance from U.S. Appl. No. 12/824,487 dated Feb. 13, 2012, pp. 1-8.
Notice of Allowance from U.S. Appl. No. 13/285,490 dated Mar. 15, 2012, pp. 1-7.
PCT Search Report from International Application No. PCT/US2006/010044 Dated Aug. 29, 2007, pp. 1-8.
PCT Search Report from International Application No. PCT/US2007/002336 dated Feb. 13, 2008, pp. 1-8.
PCT Search Report from International Application No. PCT/US2006//017036 dated May 2, 2007, pp. 1-6.
Supplementary European Search Report from Application No. EP 06 73 9005 dated Jul. 23, 2010, pp. 1-11.
Supplementary European Search Report from Application No. EP 06 73 9005 dated Aug. 10, 2010, pp. 1-7.
Notice of Rejection Grounds from Japanese Patent Application No. 2008-505335 dated Sep. 8, 2010, pp. 1-5.
Notice of Rejection Grounds from Japanese Patent Application No. 2008-512322 dated Jan. 28, 2011, pp. 1-2.
Korean Patent Application No. 10-2008-7028703, Notice of Preliminary Rejection (Non-Final) dated Sep. 30, 2010, (English translation), pp. 1-12.
U.S. Appl. No. 60/172,186, filed Dec. 17, 1999 titled "Multi-Flip-Chip Semiconductor Assembly", Inventors: Ruben Rolda, Jr. et al., pp. 1-25.
Notice of Rejection Ground from Japanese Patent Application No. 2008-512322 dated Jan. 28, 2011, (English translation), pp. 1-2.
Notice of Rejection Ground from Japanese Patent Application No. 2009-507675 dated May 10, 2011 (English translation), pp. 1-3.
Extended European Search Report from European Patent Application No. 07749404.5 dated May 17, 2011, pp. 1-10.
Korean Patent Application No. 10-2007-7026928, Notice of Preliminary Rejection (Non-Final), (English translation), Jul. 20, 2009, pp. 1-7.
Renasas News Release, "Hitachi and Renesas Develop Through-Hole Electrode Technology to Enable Interconnection of Stacked Chip at Room Temperature", date unavailable, pp. 1-2.
European Search Report, Application No. 06752168.2, Jun. 4, 2012, pp. 1-11.

* cited by examiner

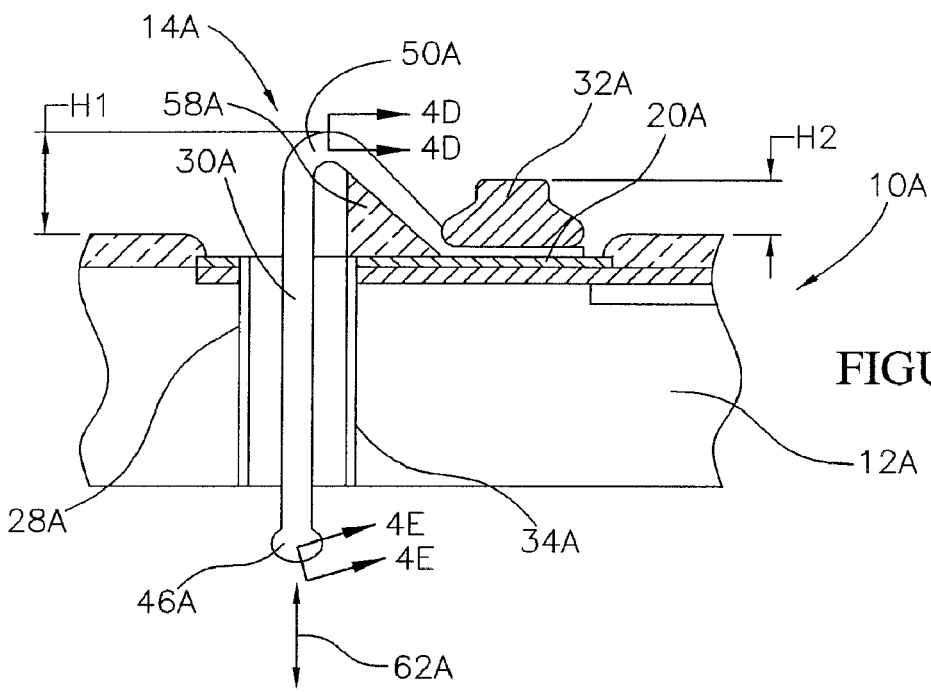
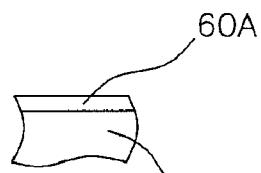
FIGURE 4D
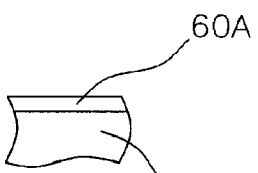
FIGURE 4E
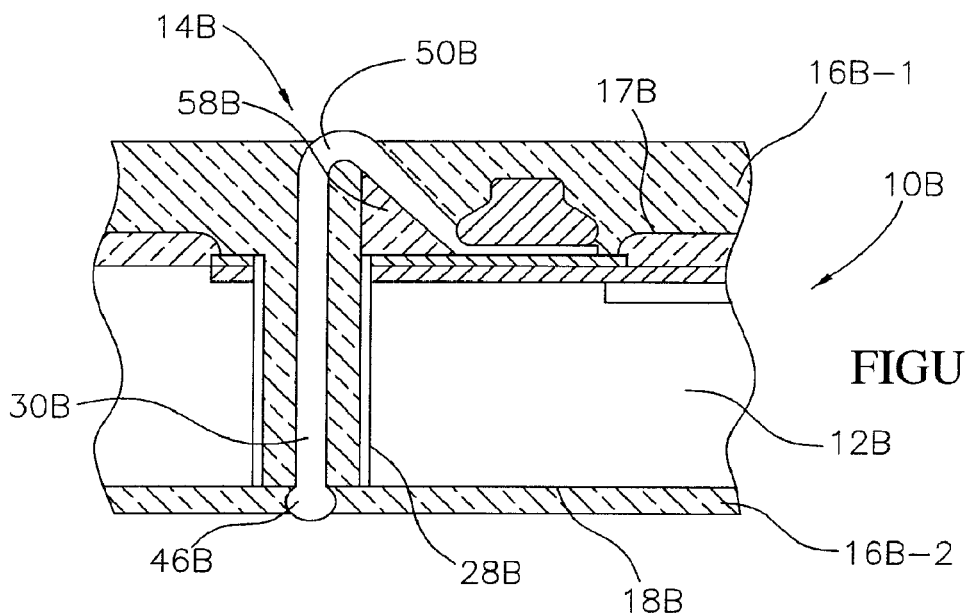

METHOD FOR FABRICATING STACKED SEMICONDUCTOR SYSTEM WITH ENCAPSULATED THROUGH WIRE INTERCONNECTS (TWI)

CROSS REFERENCE TO RELATED APPLICATIONS

This application is a continuation of Ser. No. 13/285,490 filed Oct. 31, 2011, U.S. Pat. No. 8,217,510 B2; which is a continuation of Ser. No. 12/904,314 filed Oct. 14, 2010, U.S. Pat. No. 8,120,167 B2; which is a continuation of Ser. No. 12/581,255 filed Oct. 19, 2009, U.S. Pat. No. 7,883,908 B2; which is a division of Ser. No. 11/409,638 filed Apr. 26, 2006, U.S. Pat. No. 7,659,612 B2.

This application is related to Ser. No. 11/102,408 filed Apr. 8, 2005, U.S. Pat. No. 7,371,676 B2; to Ser. No. 11/743,636 filed May 2, 2007, U.S. Pat. No. 7,682,962 B2; to Ser. No. 11/743,660 filed May 2, 2007, U.S. Pat. No. 7,728,443 B2; to Ser. No. 11/743,689 filed May 3, 2007, U.S. Pat. No. 7,757,385 B2; to Ser. No. 11/296,057 filed Dec. 7, 2005, U.S. Pat. No. 7,307,348 B2; to Ser. No. 11/712,815 filed Mar. 1, 2007, U.S. Pat. No. 7,579,267 B2; to Ser. No. 11/859,776 filed Sep. 23, 2007, U.S. Pat. No. 7,786,605 B2; to Ser. No. 11/133,085 filed May 19, 2005, U.S. Pat. No. 7,393,770 B2; to Ser. No. 12/114,757, filed May 3, 2008, U.S. Pat. No. 7,935,991 B2; to Ser. No. 12/114,761 filed May 3, 2008, U.S. Pat. No. 7,768,096 B2; to Ser. No. 12/117,919 filed May 9, 2008, U.S. Pat. No. 7,727,872 B2; to Ser. No. 11/296,057 filed Dec. 7, 2005, U.S. Pat. No. 7,307,348 B2; to Ser. No. 12/703,420 filed Feb. 11, 2010, U.S. Pat. No. 7,951,702 B2; to Ser. No. 12/703,551 filed Feb. 10, 2010, U.S. Pat. No. 7,919,846 B2; to Ser. No. 12/824,487 filed Jun. 28, 2010, U.S. Pat. No. 8,193,646 B2; to Ser. No. 13/007,743 filed Jan. 17, 2011, U.S. Pat. No. 8,053,909 B2; to Ser. No. 13/076,505 filed Mar. 31, 2011, Publication No. US 2011/0175223; to Ser. No. 13/285,490 filed Oct. 31, 2011, Publication No. 2012/0043670; to Ser. No. 13/480,528 filed May 25, 2012; and to Ser. No. 12/703,520, filed Feb. 10, 2010, U.S. Pat. No. 7,951,702 B2.

BACKGROUND

In semiconductor manufacture, packaging is the final operation that transforms a semiconductor substrate into a functional semiconductor component. Typically, the semiconductor substrate is in the form of a semiconductor die. Packaging provides protection for the semiconductor substrate, a signal transmission system for the integrated circuits on the semiconductor substrate, and external connection points for the component. In response to the demand for smaller, lighter and thinner consumer products, new semiconductor components and new packaging methods are being developed. The new components include high pin count single die packages, such as fine ball grid array (FBGA) packages, and multi dice packages, such as stacked packages and systems in a package (SIP).

The new packaging methods include wafer level packaging (WLP), stacking of multiple semiconductor dice, and 3D packaging. With wafer level packaging (WLP), all of the packaging operations are performed on a semiconductor wafer containing multiple identical semiconductor substrates. In addition, all of the interconnects for a semiconductor component are located within the peripheral outline of the component. Following wafer level packaging (WLP), the semiconductor components are singulated from the wafer into chip scale components. In general, wafer level packaging (WLP) provides smaller components and low cost volume manufacture.

With stacking, two or more semiconductor components are stacked and interconnected into a stacked system. A signal transmission system for a stacked system includes interconnects which electrically connect adjacent stacked components. In addition, the signal transmission system must provide terminal contacts for inputting and outputting signals into the system. The signal transmission system for a 3D component includes interconnects that are vertically integrated, and not necessarily planar to the major planar surfaces of the component. For example, interconnects in the form of through wafer conductive vias can provide signal paths between opposing planar surfaces of a semiconductor component.

In general, new types of interconnects have been developed for implementing signal transmission systems to and from the integrated circuits contained on the components. These interconnects must satisfy demanding electrical requirements. For example, the interconnects must be capable of a high density configuration, with minimal signal path lengths and minimal cross talk. The interconnects must also have the ability to accommodate thermal mechanical stresses, and to provide power distribution with controlled impedance over a wide frequency range. In addition, the interconnects must be capable of reliable manufacture using readily available, or easily modifiable, semiconductor assembly equipment.

Various embodiments of through wire interconnects to be further described are able to satisfy the above requirements. In addition, the through wire interconnects provide a signal transmission system with 3-D integration, and with contacts suitable for stacking multiple semiconductor components, or for mounting semiconductor components to a next level substrate. Further, the through wire interconnects are capable of volume manufacture in reliable configurations using semiconductor assembly equipment.

However, the foregoing examples of the related art and limitations related therewith, are intended to be illustrative and not exclusive. Other limitations of the related art will become apparent to those of skill in the art upon a reading of the specification and a study of the drawings.

BRIEF DESCRIPTION OF THE DRAWINGS

Exemplary embodiments are illustrated in the referenced figures of the drawings. It is intended that the embodiments and the figures disclosed herein are to be considered illustrative rather than limiting.

FIG. 4C is an enlarged schematic cross sectional view taken along line 4C-4C of FIG. 4A illustrating a through wire interconnect (TWI) of the semiconductor component of FIG. 4A;

FIG. 4D is an enlarged schematic cross sectional view taken along section line 4D-4D of FIG. 4C illustrating an outer layer of the through wire interconnect (TWI);

FIG. 4E is an enlarged schematic cross sectional view taken along section line 4E-4E of FIG. 4C illustrating the outer layer of the through wire interconnect (TWI);

FIG. 5 is a schematic side elevation view equivalent to FIG. 4C of an alternate embodiment 2× semiconductor component encapsulated on opposing sides;

DETAILED DESCRIPTION

As used herein, "semiconductor component" means an electronic element that includes a semiconductor substrate or makes contact with a semiconductor substrate. "Semiconductor substrate" means an electronic element, such as a semiconductor die, or a semiconductor package that includes integrated circuits and semiconductor devices. "Interconnect" means an electrical element which electrically connects different electrical elements and transmits signals between these elements. "Wafer-level" means a process conducted on an element, such as a semiconductor wafer, containing multiple semiconductor components or substrates. "Die level" means a process conducted on a singulated element, such as a singulated semiconductor die or package. "Chip scale" means having an outline about the same as that of a semiconductor die. "Wafer size" means having an outline about the same as that of a semiconductor wafer.

Figure 1A:
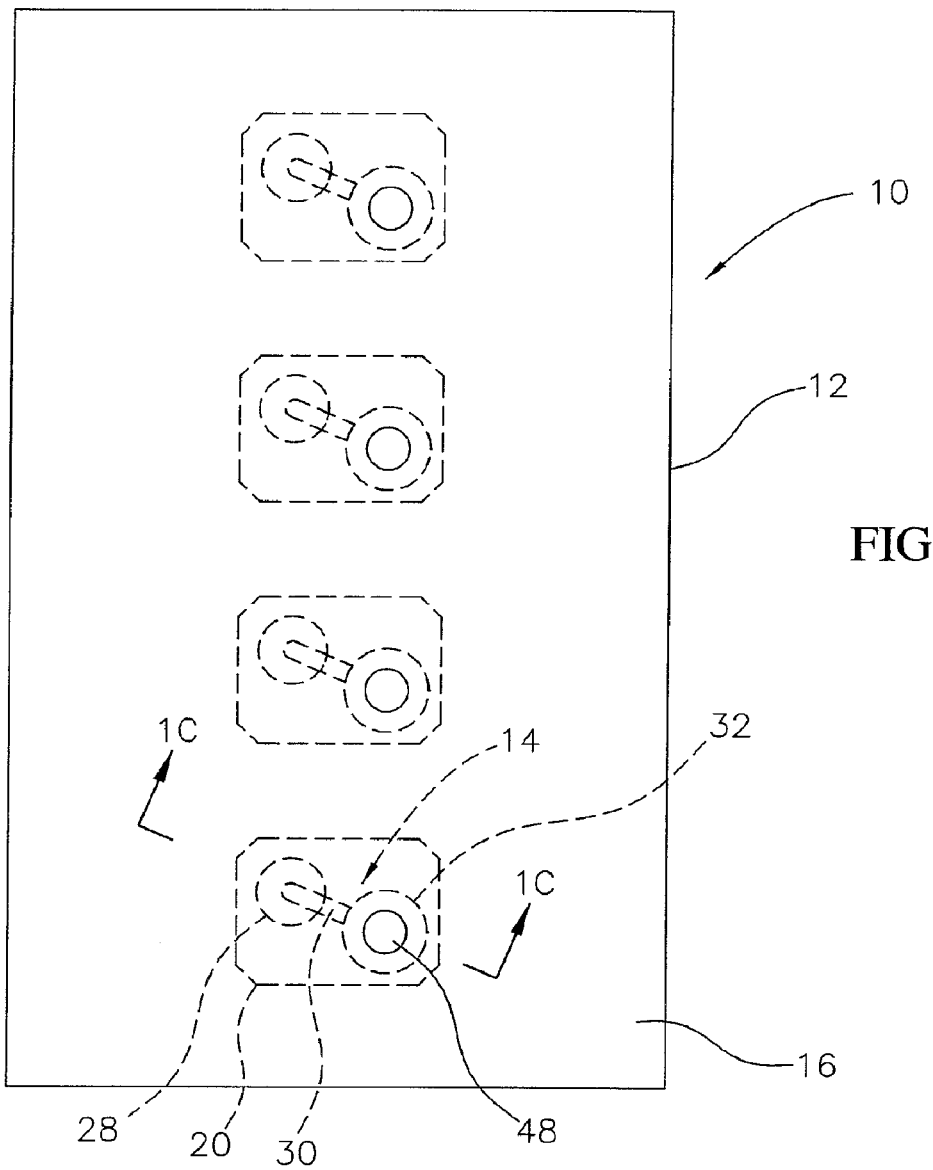
FIG. 1A is a schematic plan view of a semiconductor component having through wire interconnects (TWI)
Figure 1B:
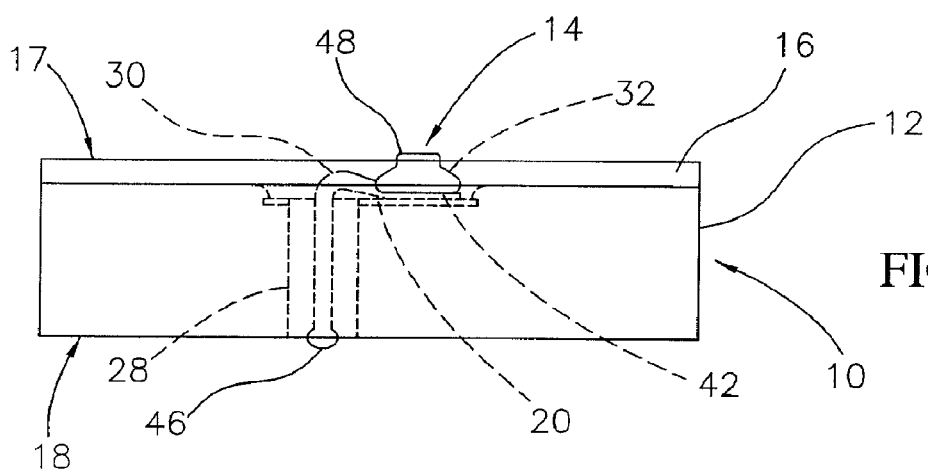
FIG. 1B is a schematic side elevation view of the semiconductor component of FIG. 1A.
Figure 1C:
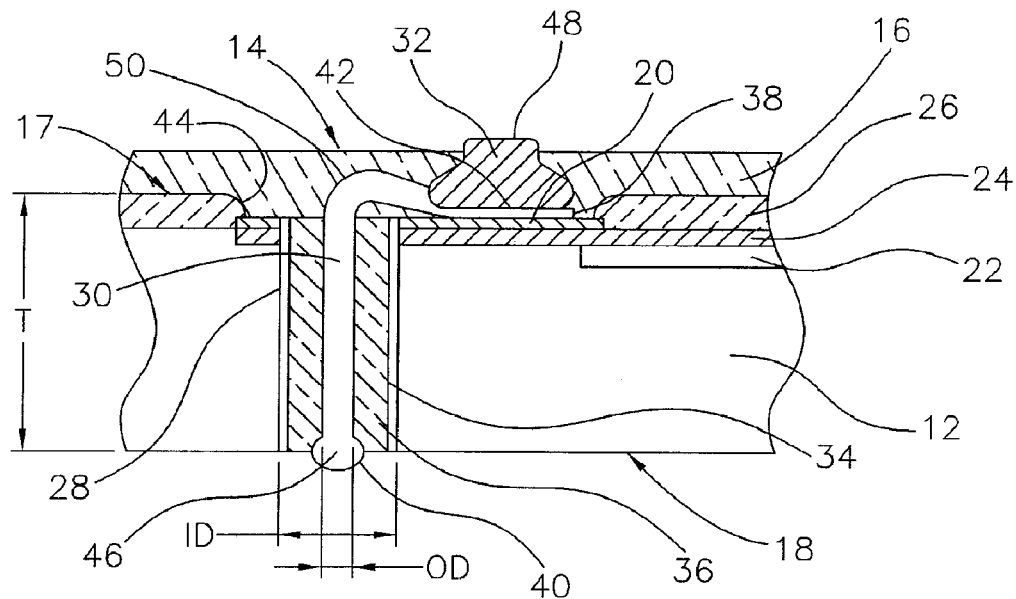
FIG. 1C is an enlarged schematic cross sectional view taken along section line 1C-1C of FIG. 1A illustrating a through wire interconnect (TWI) of the semiconductor component.

Referring to FIGS. 1A-1C, a semiconductor component 10 (FIG. 1A) is illustrated. The semiconductor component 10 (FIG. 1A) includes a semiconductor substrate 12 (FIG. 1B); a plurality of through wire interconnects 14 (FIG. 1B) on the semiconductor substrate 12; and a polymer layer 16 on the semiconductor substrate 12 encapsulating at least a portion of each through wire interconnect 14. The semiconductor substrate 12 (FIG. 1B) can comprise a conventional semiconductor die, or a thinned semiconductor die, having integrated circuits 22 (FIG. 1C) constructed in a desired electrical configuration using active semiconductor devices such as transistors. For example, the semiconductor substrate 12 (FIG. 1B) can comprise a high speed digital logic device, such as a dynamic random access memory (DRAM), a static random access memory (SRAM), a flash memory, a microprocessor, a digital signal processor (DSP), an application specific integrated circuit (ASIC), an imager device, or a MEMS type device (e.g., accelerometer, microphone, speaker, electro mechanical device). In addition, the semiconductor substrate 12 (FIG. 1B) can comprise a tested die that has been certified as a known good die.

As shown in FIG. 1A, in the illustrative embodiment, the semiconductor substrate 12 is a generally rectangular shaped die having opposed lateral edges and opposed longitudinal edges. However, the semiconductor substrate 12 (FIG. 1A) can have any polygonal shape, such as square or triangular, and can also have a circular or oval shape. In addition, the semiconductor substrate 12 can comprise a full thickness semiconductor die or a thinned semiconductor die. As shown in FIG. 1C, the semiconductor substrate 12 includes a circuit side 17 ("first side" in some of the claims), and a back side 18 ("second side" in some of the claims).

As also shown in FIG. 1A, the semiconductor substrate 12 includes a plurality of substrate contacts 20 on the circuit side 17, which in the illustrative embodiment comprise the device bond pads. Alternately, rather than being the device bond pads, the substrate contacts 20 can comprise redistribution contacts (i.e., contacts formed in conjunction with a redistribution layer (RDL)). In addition, the substrate contacts 20 can comprise a highly-conductive, wire-bondable metal, such as aluminum or copper. The substrate contacts 20 can also comprise stacks of different metals, such as aluminum-nickel-gold, aluminum-nickel-solder, copper-palladium, and aluminum on copper.

As another alternative, at least some of the substrate contacts 20 (FIG. 1A) can comprise special purpose contacts formed specifically for constructing the through wire interconnects 14. For example, the substrate contacts 20 can comprise electrically isolated contacts, that are not in electrical communication with the integrated circuits 22 (FIG. 1C) on the semiconductor substrate 12. As will be further explained, this concept can be employed in stacked components to reduce unwanted capacitance, noise, bleed off voltage and bleed off current.

For simplicity, the semiconductor substrate 12 (FIG. 1A) is illustrated with only four substrate contacts 20 (FIG. 1A)

arranged in a single row. However, in actual practice the semiconductor substrate 12 (FIG. 1A) can include tens of substrate contacts 20 (FIG. 1A) arranged in a desired configuration, such as a center array, an edge array or an area array. Also in the illustrative embodiment, the substrate contacts 20 (FIG. 1A) have a generally rectangular peripheral outline and angled corners. However, as with the semiconductor substrate 12 (FIG. 1A), the substrate contacts 20 (FIG. 1A) can have any polygonal shape including square, circular, triangular and oval. In addition, a size of the substrate contacts 20 (FIG. 1C) can be selected as required. For example, each substrate contact 20 (FIG. 1C) can have a length (L) (FIG. 1C) of from about 50 μm to 200 μm and a width (W) (FIG. 1C) of from about 50 μm to 200 μm. Also in FIG. 1A, each substrate contact 20 has an associated through wire interconnect 14. However, the through wire interconnects 14 can also be formed on only selected substrate contacts 20. For example, only the substrate contacts 20 having a selected output or input configuration (e.g., Vss, Vcc) can be equipped with a through wire interconnect 14.

As shown in FIG. 1C, the substrate contacts 20 can be in electrical communication with internal conductors 24 located within the semiconductor substrate 12 proximate to the circuit side 17. In addition, the internal conductors 24 are in electrical communication with the integrated circuits 22 in the semiconductor substrate 12. The internal conductors 24 (FIG. 1C) can be part of the internal structure of the semiconductor substrate 12, and can comprise a highly conductive metal, such as aluminum or copper. Further, a die passivation layer 26 (FIG. 1C) proximate to the circuit side 16 protects the internal conductors 24 (FIG. 1C) and the integrated circuits 22 (FIG. 1C). The die passivation layer 26 (FIG. 1C) can comprise an electrically insulating material, such as BPSG (borophosphosilicate glass), a polymer or an oxide. In addition, the die passivation layer 26 (FIG. 1C) includes openings 44 (FIG. 1C) aligned with the substrate contacts 20 which provide access to the substrate contacts 20. All of the elements of the semiconductor substrate 12 including the integrated circuits 22 (FIG. 1C), the internal conductors 24 (FIG. 1C), and the die passivation layer 26 (FIG. 1C), can be formed using well known semiconductor fabrication processes.

As also shown in FIG. 1C, the through wire interconnect 14 includes a via 28 through the substrate contact 20 and the semiconductor substrate 12, a wire 30 in the via 28, a bonding member 32 on the wire 30 and the substrate contact 20, and a polymer material 36 in the via 28.

The via 28 (FIG. 1C) extends through the substrate contact 20, and through the full thickness of the semiconductor substrate 12, from the circuit side 17 to the back side 18 thereof. In the illustrative embodiment, the via 28 (FIG. 1C) is generally circular, and has an inside diameter (ID) which is about 1.5 to 3 times larger than the outside diameter (OD) of the wire 30 (FIG. 1C). By way of example, the wire 30 (FIG. 1C) can have an outside diameter (OD) of about 25 μm, and the via 28 (FIG. 1C) can have an inside diameter (ID) of about 37.5 μm to 75 μm. In addition, a length of the via 28 (FIG. 1C) is dependent on an overall thickness T of the semiconductor substrate 12 (FIG. 1C). A representative range for the thickness T of the semiconductor substrate 12 (FIG. 1C) can be from about 10 μm to 725 μm, depending on whether the semiconductor substrate 12 is a thinned or a full thickness die or wafer.

The via 28 (FIG. 1C) can also include an insulating layer 34 (FIG. 1C) formed on an inside diameter thereof, which electrically insulates the via 28 (FIG. 1C) from the integrated circuits 22 (FIG. 1C), and other electrical elements on the semiconductor substrate 12. The insulating layer 34 (FIG. 1C) can comprise an electrically insulating material, such as a polymer (e.g., polyimide or parylene) or an oxide (e.g., $SiO_2$). Alternately, the wire 30 (FIG. 1C), rather than the via 28 (FIG. 1C), or in addition to the via 28 (FIG. 1C), can be electrically insulated.

In FIG. 1A, the via 28 is illustrated as being located in an upper left hand corner of the substrate contact 20. In other words, the via 28 is offset in both x and y directions from a center of the substrate contact 20. In this case, the via 28 can have an inside diameter (ID) (FIG. 1C) that is about one half of the width (L) (FIG. 1C) of the substrate contact 20 (FIG. 1C). Alternately, the via 28 can be located anywhere on the substrate contact 20 such as in the center of the substrate contact 20. Also, rather than just one via 28, the substrate contact 20 can include multiple vias 28.

As shown in FIG. 1C, the wire 30 is located along a longitudinal axis of the via 28, and extends across the entire length of the via 28. The wire 30 (FIG. 1C) can be held in place in the via 28 (FIG. 1C) by the polymer material 36 (FIG. 1C), which fills the via 28 (FIG. 1C) and surrounds the wire 30 (FIG. 1C). The polymer material 36 can comprise an electrically insulating curable polymer, such as a polyimide, an epoxy or a silicone. Also, the polymer material 36 (FIG. 1C) can include fillers, such as silicates, configured to reduce the coefficient of thermal expansion (CTE) and adjust the viscosity of the dielectric material. Suitable curable polymers are manufactured by Shinitsu of Japan, and Dexter Electronic Materials of Rocky Hill, Conn. For some applications, the polymer material 36 can comprise an electrically conductive material, such as a nano particle conductive polymer.

As also shown in FIG. 1C, the wire 30 (FIG. 1C) includes a loop portion 50, and a first end 38 (FIG. 1C) extending out of the via 28 (FIG. 1C) and bonded to the substrate contact 20 (FIG. 1C). The wire 30 (FIG. 1C) also includes a second end 40 (FIG. 1C) proximate to the back side 18 (FIG. 1C) of the semiconductor substrate 12. The through wire interconnect 14 (FIG. 1C) also includes a bonded connection 42 (FIG. 1C) between the first end 38 (FIG. 1C) of the wire 30 and the substrate contact 20. In addition, the second end 40 (FIG. 1C) of the wire 30 can comprise a second contact in the form of a generally spherically shaped contact ball 46, such as a "free air ball" formed using an electronic flame off (EFO) process during the bonding process.

In the through wire interconnect 14 (FIG. 1C), the bonded connection 42 (FIG. 1C) comprises a wedge bond formed using a ball bonding process, such as thermosonic or thermocompressive wire bonding. Alternately, a bonded connection can comprise a wedge bond formed using ultrasonic wire bonding. As another alternative, the wire 30 can comprise a bonding ribbon, and a bonded connection can comprise a ribbon wire bond. As another alternative, the wire 30 can comprise a compressed wire, and a bonded connection can be in the form of a stud bump and a compression flange on the compressed wire.

U.S. patent application Ser. No. 11/296,057 filed on Dec. 7, 2005, entitled "Semiconductor Components having Through Wire Interconnects (TWI), And Methods And Systems For Fabricating Semiconductor Components", which is incorporated herein by reference, describes method and systems for fabricating semiconductor components with through wire interconnects. U.S. patent application Ser. No. 11/102,408 filed on Apr. 8, 2005 entitled "Method And System For Fabricating Semiconductor Components With Through Wire Interconnects", which is also incorporated herein by reference, also describes methods and systems for fabricating semiconductor components with through wire interconnects.

A representative outside diameter (OD) (FIG. 1C) of the wire 30 can be from about 12 μm to about 150 μm. In addition, the wire 30 (FIG. 1C) can comprise a conventional wire material used in semiconductor packaging, such as solder alloys, gold, gold alloys, copper, copper alloys, silver, silver alloys, aluminum, aluminum-silicon alloys, and aluminum-magnesium alloys. In addition, the wire 30 (FIG. 1C) can comprise a metal, or a metal alloy, that does not contain reductions of hazardous substances (ROHS), such as lead. Exemplary ROHS free metals include lead free solders, such as 97.5% Sn2.5% Ag. Other ROHS free metals include gold, copper and alloys of these metals such as copper coated with a layer of flash gold. Also, the melting point of the wire 30 (FIG. 1C) should preferably be greater than that of the substrate contact 20. Further, the wire 30 can comprise an insulated bonding wire having an electrically insulating outer layer, such as a polymer. The insulating layer on the wire 30 can take the place of the insulating layers 34 (FIG. 1C). This type of insulated bonding wire is available from Micro Bond of Canada.

As also shown in FIG. 1A, in the through wire interconnect 14, the bonding member 32 is located next to the via 28, and is bonded to the substrate contact 20 in a right, lower quadrant of the substrate contact 20. Alternately, the bonding member 32 (FIG. 1C) can be centered on the substrate contact 20 (FIG. 1C) and on the via 28 (FIG. 1C), or located on any portion of the substrate contact 20 (FIG. 1C) or the via 28 (FIG. 1C).

The bonding member 32 (FIG. 1C) bonds the first end 38 of the wire 30 (FIG. 1C) to the substrate contact 20 (FIG. 1C). In addition, the bonding member 32 (FIG. 1C) functions as a first contact for the through wire interconnect, as a securing and supporting structure for the wire 30 (FIG. 1C), and as a bonding structure for bonding the through wire interconnect 14 (FIG. 1C) to an external electrical element, such as contacts on a support substrate, or another through wire interconnect on another semiconductor component. The bonding member 32 (FIG. 1C) preferably comprises a non oxidizing, bondable material such as gold or platinum, or an easily reflowable material, such as solder.

In the illustrative embodiment, the bonding member 32 (FIG. 1C) comprises a stud bump, or a ball bump, bonded to the substrate contact 20. In this case, the bonding member 32 (FIG. 1C) can be formed using a wire bonder, a stud bumper, or a ball bumper. Alternately, the bonding member 32 (FIG. 1C) can comprise a solder bump, a welded connection, or a conductive polymer connection. In FIG. 1C, the bonding member 32 has a diameter which is less than the length (L) and the width (W) of the substrate contact 20 (e.g., 25% to 75%), such that it covers only a portion of the substrate contact 20, and does not cover the via 28. However, a bonding member can also be configured to substantially cover the substrate contact 20 and the via 28.

As shown in FIG. 1B, the polymer layer 16 substantially covers the circuit side 17 of the substrate 12, and has a peripheral outline matching that of the substrate 12. Alternately, the polymer layer 16 can cover only selected portions of the circuit side 17 of the substrate 12, such as only the areas surrounding the substrate contacts 20. As shown in FIG. 1C, the polymer layer 16 encapsulates the substrate contacts 20 and loop portions 50 of the wires 30 of the through wire interconnects 14. The polymer layer 16 also substantially encapsulates the bonding member 32. However, a tip portion 48 of the bonding member 32 remains unencapsulated by the polymer layer 16, and forms a first contact for the through wire interconnect 14 proximate to the circuit side 17.

The polymer layer 16 (FIG. 1C) can comprise a curable polymer material such as silicone, polyimide, epoxy parylene or a molding compound. In addition, these materials can include fillers, such as silicates, configured to reduce the coefficient of thermal expansion (CTE), and adjust the viscosity of the polymer material. One suitable curable polymer material is manufactured by Dexter Electronic Materials of Rocky Hill, Conn. under the trademark "HYSOL" FP4450. One suitable molding compound is manufactured by JSR Micro of North America under the product designation JSR WPR-S170P. Other molding compounds particularly suited for the film assisted molding process to be hereinafter described are manufactured by Shin-Etsu Chemical Co. Ltd. of Japan.

The polymer layer 16 (FIG. 1C) has a planar surface which facilitates stacking of the semiconductor component 10 (FIG. 1A) to another component, or to a next level substrate. In addition, the polymer layer 16 (FIG. 1C) encapsulates the wire 30 (FIG. 1C), the loop portion 50 (FIG. 1C) of the wire 30 (FIG. 1C), and the bonding member 32 (FIG. 1C).

Figure 2A:
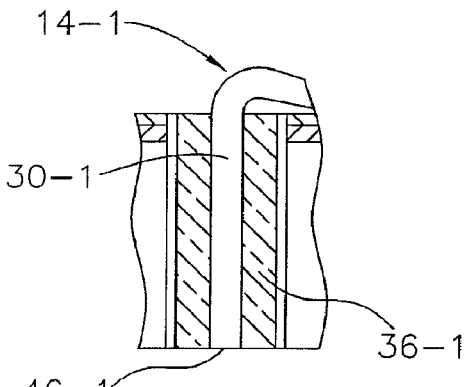
FIGS. 2A-2L are enlarged schematic cross sectional views of alternate embodiments of the through wire interconnect (TWI) shown in FIGS. 1A-1C.
Figure 2B:
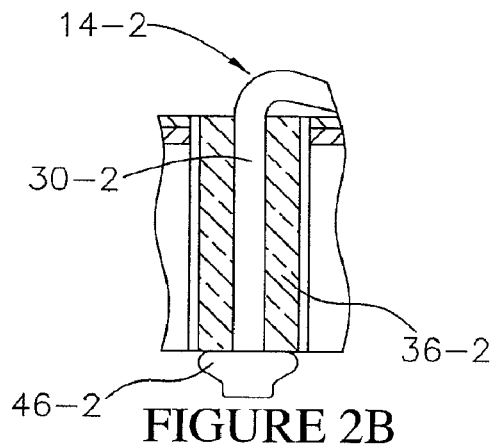
Figure 2C:
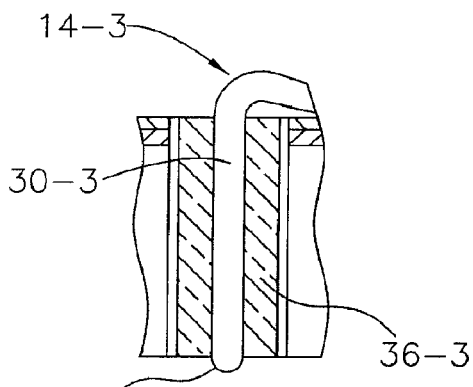
Figure 2D:
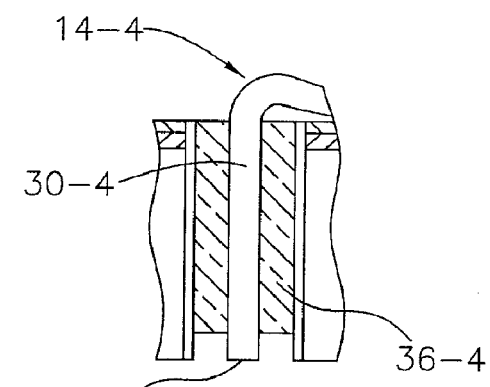
Figure 2E:
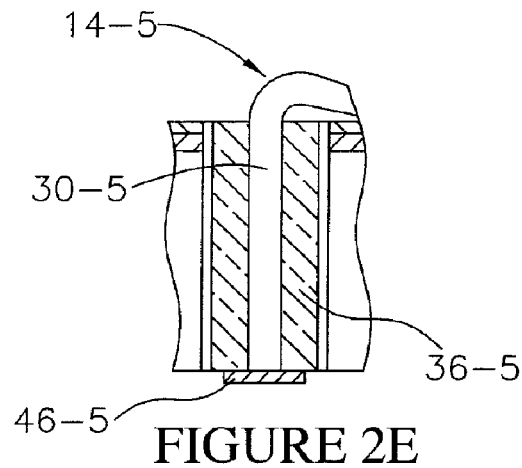
Figure 2F:
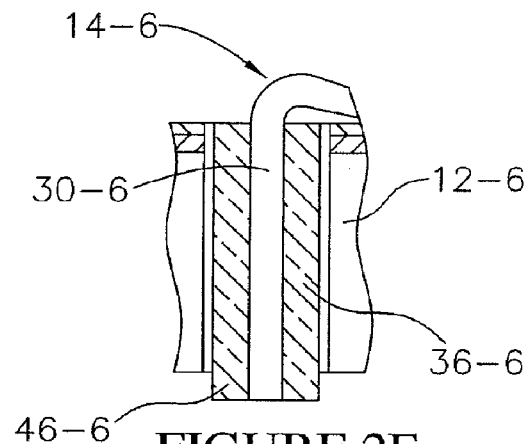
Figure 2G:
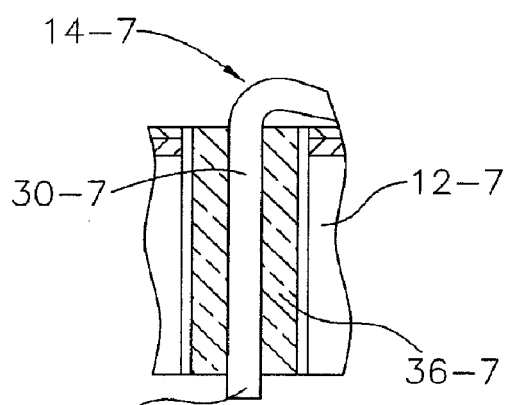
Figure 2H:
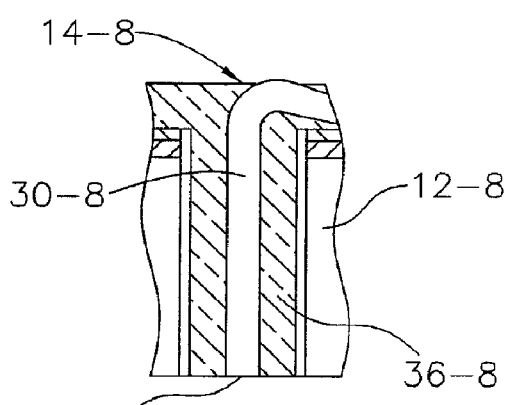
Figure 2I:
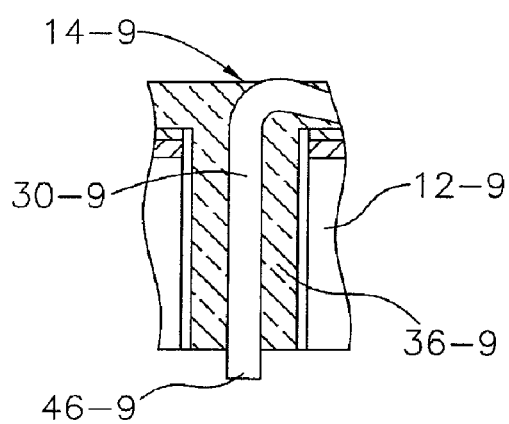
Figure 2J:
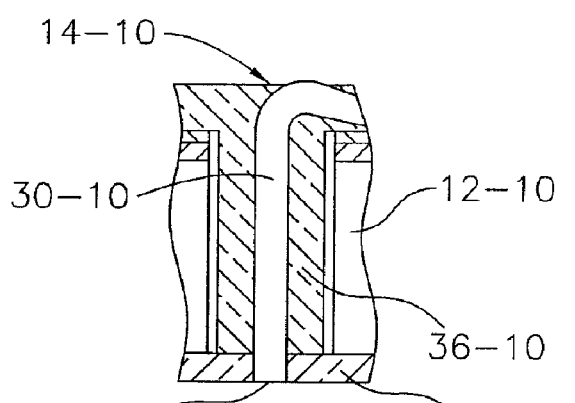
Figure 2K:
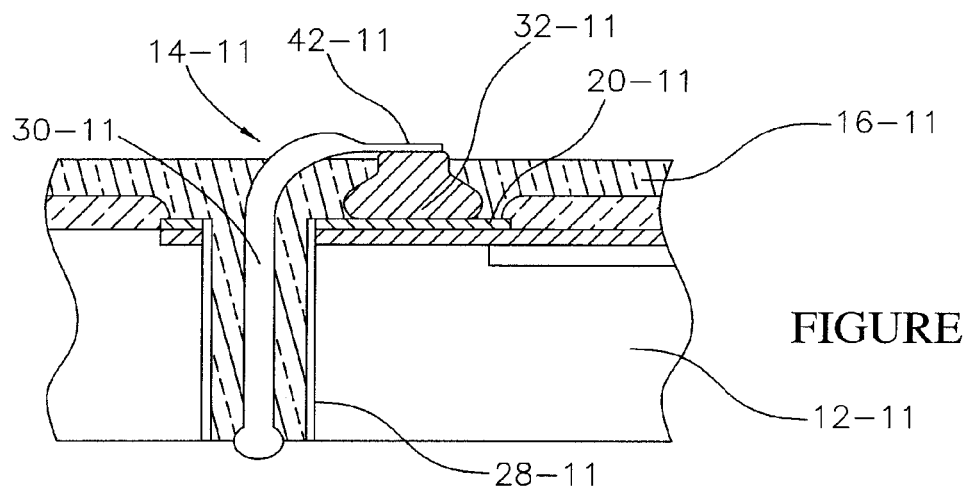
Figure 2L:
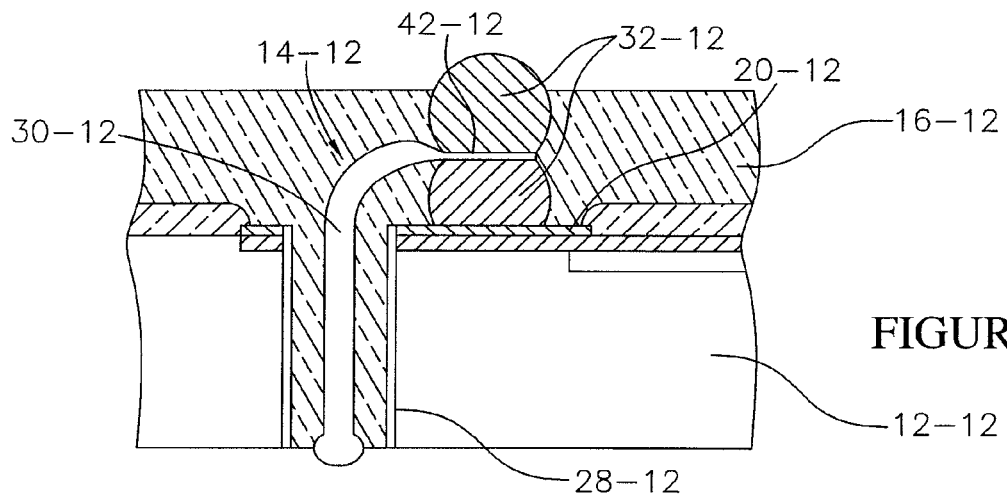
Figure 2M:
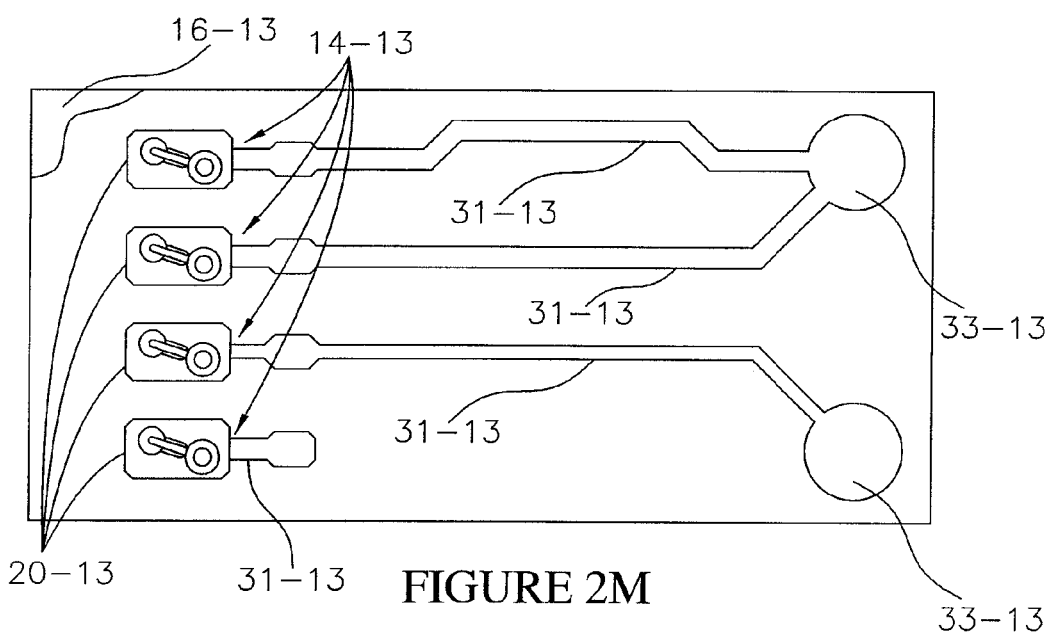
FIG. 2M is an enlarged schematic plan view of an alternate embodiment of the through wire interconnects (TWI) shown in FIGS. 1A-1C.
Figure 2N:
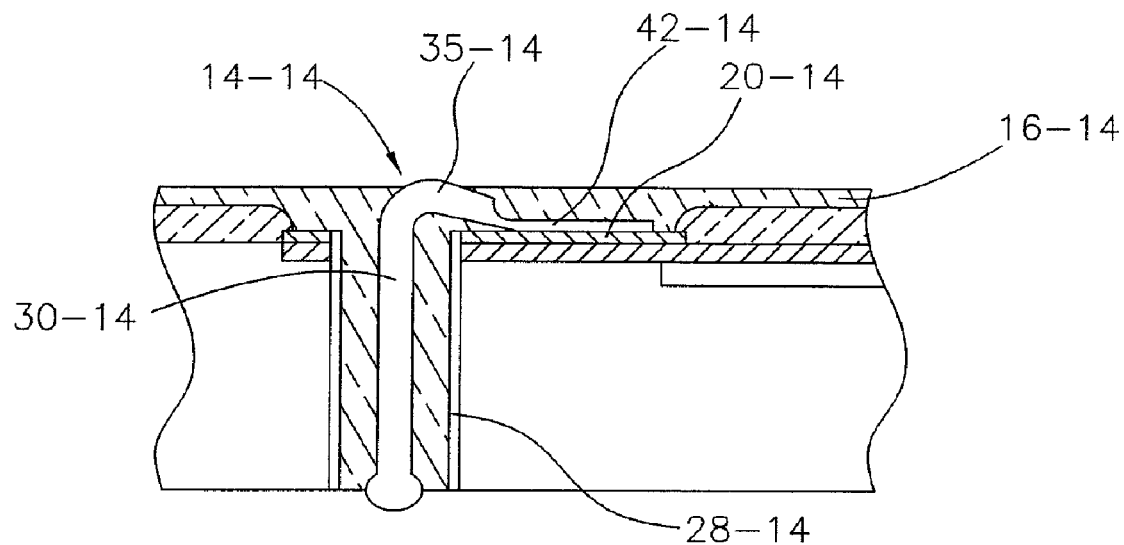
FIGS. 2N-2O are enlarged schematic cross sectional views of alternate embodiments of the through wire interconnects (TWI) shown in FIGS. 1A-1C.
Figure 2O:
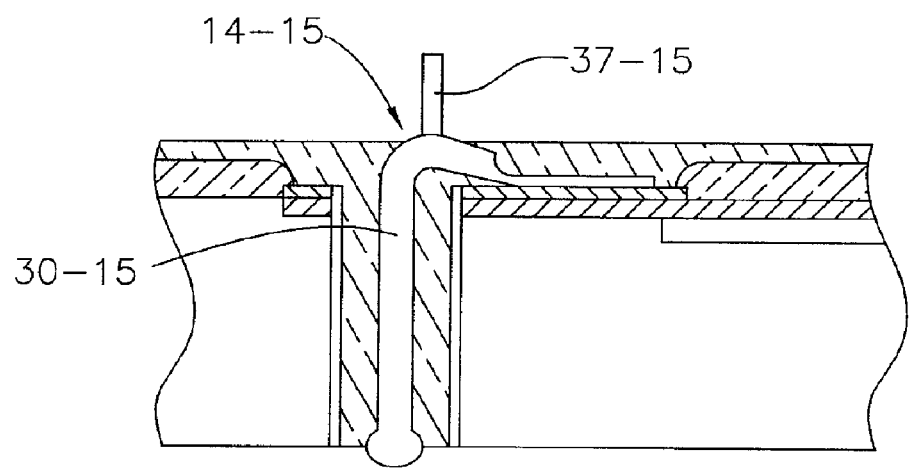

Referring to FIGS. 2A-2O, alternate embodiment through wire interconnects 14-1 to 14-15 are illustrated. The through wire interconnects 14-1 to 14-15 are all substantially similar to the through wire interconnect 14 (FIGS. 1A-1C).

In FIG. 2A, a through wire interconnect 14-1 includes a wire 30-1 encapsulated by a polymer material 36-1, and a second contact 46-1 in the form of a planar end of the wire 30-1. In addition, the polymer material 36-1 and the second contact 46-1 have a same planar surface.

In FIG. 2B, a through wire interconnect 14-2 includes a wire 30-2 encapsulated by a polymer material 36-2, and a second contact 46-2 in the form of a stud bump or a ball bump on the wire 30-2 and the polymer material 36-2.

In FIG. 2C, a through wire interconnect 14-3 includes a wire 30-3 encapsulated by a polymer material 36-3, and a second contact 46-3 in the form of a metal bump, such as solder, gold, or nickel on the end of the wire 30-1. In this embodiment the second contact 46-3 can comprise a meniscus solder coated end. Alternately, with the wire 30-3 comprising gold, the second contact 46-3 can comprise nickel plated with a solder bump or ball.

In FIG. 2D, a through wire interconnect 14-4 includes a wire 30-4 encapsulated by a polymer material 36-3 that is etched back to expose a second contact 46-4 on the wire 30-4.

In FIG. 2E, a through wire interconnect 14-5 includes a wire 30-5 encapsulated by a polymer material 36-5, and a second contact 46-5 in the form of a planar metal pad on the wire 30-5 and the polymer material 36-5.

In FIG. 2F, a through wire interconnect 14-6 includes a wire 30-6 encapsulated by a polymer material 36-6. In addition, a substrate 12-6 is etched back to expose the polymer material 36-6. Further, a second contact 46-6 comprises a planar end of the wire 30-6 and the polymer material 36-6 have a same planar surface.

In FIG. 2G, a through wire interconnect 14-7 includes a wire 30-7 encapsulated by a polymer material 36-7. In addition, both the polymer material 36-7 and a back side of a substrate 12-7 are etched back to expose a second contact 46-7 which comprises an end of the wire 30-7.

In FIG. 2H, a through wire interconnect 14-8 includes a wire 30-8 encapsulated by a polymer material 36-8. However, the polymer material 36-8 also encapsulates the circuit side of the substrate 12-8. In this embodiment, the polymer material 36-8 takes the place of both the polymer layer 16 (FIG. 1C) and the polymer material 36 (FIG. 1C). As will be further explained, the polymer material 36-8 can be formed using a film assisted molding process. The through wire interconnect 14-8 also includes a second contact 46-8 which comprises a planar end of the wire 30-8, which is co-planar to the polymer material 36-8.

In FIG. 2I, a through wire interconnect 14-9 includes a wire 30-9 encapsulated by a polymer material 36-9. As with the previous embodiment, the polymer material 36-9 also encapsulates the circuit side of the substrate 12-9. The through wire interconnect 14-9 also includes a second contact 46-9 which comprises an end of the wire 30-9 projecting from a surface of the polymer material 36-9.

In FIG. 2J, a through wire interconnect 14-10 includes a wire 30-10 encapsulated by a polymer material 36-10. As with the previous embodiment, the polymer material 36-10 also encapsulates the circuit side of the substrate 12-10. The through wire interconnect 14-10 also includes a back side polymer layer 16-10, and a second contact 46-10 which comprises a planar end of the wire 30-10 co-planar to the back side polymer layer 16-10.

In FIG. 2K, a through wire interconnect 14-11 includes a wire 30-11 bonded to a tip portion of a bonding member 32-11. In this embodiment, a bonded connection 42-11 is formed between the wire 30-11, and the tip portion of the bonding member 32-11. For example, the bonding member 32-11 can comprise a stud bump bonded to the substrate contact 20-11, and the bonded connection 42-11 can comprise a ball bond formed on the stud bump. Alternately, the bonded connection 42-11 can be formed anywhere on the bonding member 32-11 such as in the center, or on an exterior surface thereof. A polymer layer 16-11 substantially encapsulates the through wire interconnect 14-11, but leaves the bonded connection 42-11 and the tip portion of the bonding member 32-11 exposed as a first contact for the through wire interconnect 14-11. In addition, the polymer layer 16-11 also fills the via 28-11 and secures the wire 30-11 therein, substantially as previously described for polymer material 36 (FIG. 1C). The polymer layer 16-11 can be formed using a film assisted molding process to be hereinafter described.

In FIG. 2L, a through wire interconnect 14-12 includes a bonding member 32-12 in the form of a double bump. In this embodiment, a bonded connection 42-12 comprises a wire 30-12 within the bonding member 32-12 sandwiched between the double bumps. Alternately, the bonded connection 42-12 can be formed between the lowermost bump of the bonding member 32-12 and the substrate contact 20-12. U.S. Pat. Nos. 5,496,775 and 6,717,245, both of which are incorporated herein by reference, disclose double bump structures and techniques. A polymer layer 16-12 substantially encapsulates the through wire interconnect 14-12, but leaves a portion of the bonding member 32-12 exposed as a first contact for the through wire interconnect 14-12. In addition, the polymer layer 16-12 also fills the via 28-12 and secures the wire 30-12 therein, substantially as previously described for polymer material 36 (FIG. 1C). The polymer layer 16-12 can be formed using a film assisted molding process to be hereinafter described.

In FIG. 2M, through wire interconnects 14-13 include redistribution conductors 31-13 and pads 33-13 in electrical communication with the substrate contacts 20-13. The pads 33-13 can comprise test pads, wire bonding pads, outer lead bond OLB pads, or extended rdl pads. In addition, the through wire interconnects 14-13 include a polymer layer 16-13, which has been cut away to show the redistribution conductors 31-13 and pads 33-13. The polymer layer 16-13 also includes windows or openings which provide access to the pads 33-13. The pads 33-13 permit temporary electrical connections to be made for performing test procedures, such as functional, parametric and burn-in testing. For example, the integrated circuits 22 (FIG. 1C) on the semiconductor substrate 12 (FIG. 1C) can be tested or "probed" prior to fabrication or partially fabrication of the through wire interconnects 16-13. The redistribution conductors 31-13 and the pads 33-13 can have any desired pattern, and can connect multiple through wire interconnects 14-13 together substantially as shown in FIG. 2M. As also shown in FIG. 2M, some of the through wire interconnects 14-13 do not include an associated pad 33-13.

In FIG. 2N, a through wire interconnect 14-14 includes a bonded connection 42-14 in the form of a wedge bond formed between the wire 30-14 and the substrate contact 20-14 using an ultra sonic or wedge bonding process. Alternately, the bonded connection 42-14 can comprise a ball bond formed using a thermosonic or thermocompression bond. In addition, there is no bonding member 32 (FIG. 1C) on the bonded connection 42-14. A polymer layer 16-14 encapsulates the through wire interconnect 14-14, while leaving a tip portion 35-14 of the wire 30-14 exposed as a first contact for the through wire interconnect 14-14. The polymer layer 16-14 also fills the via 28-14 and secures the wire 30-14 therein, substantially as previously described for polymer material 36 (FIG. 1C). As will be further explained, the tip portion 35-14 can also include a wear resistant or penetration enhancing layer. In addition, the polymer layer 16-14 can be formed using a film assisted molding process to be hereinafter described.

In FIG. 2O, a through wire interconnect 14-15 is substantially similar to the through wire interconnect 14-14 (FIG. 2N). However, the through wire interconnect 14-15 also includes a projection 37-15, such as a metal pin, a ball bump or a stud bump, on the tip portion of the wire 30-15. In this embodiment, the projection 37-15 functions as a first contact for the through wire interconnect 14-15.

Figure 3A:
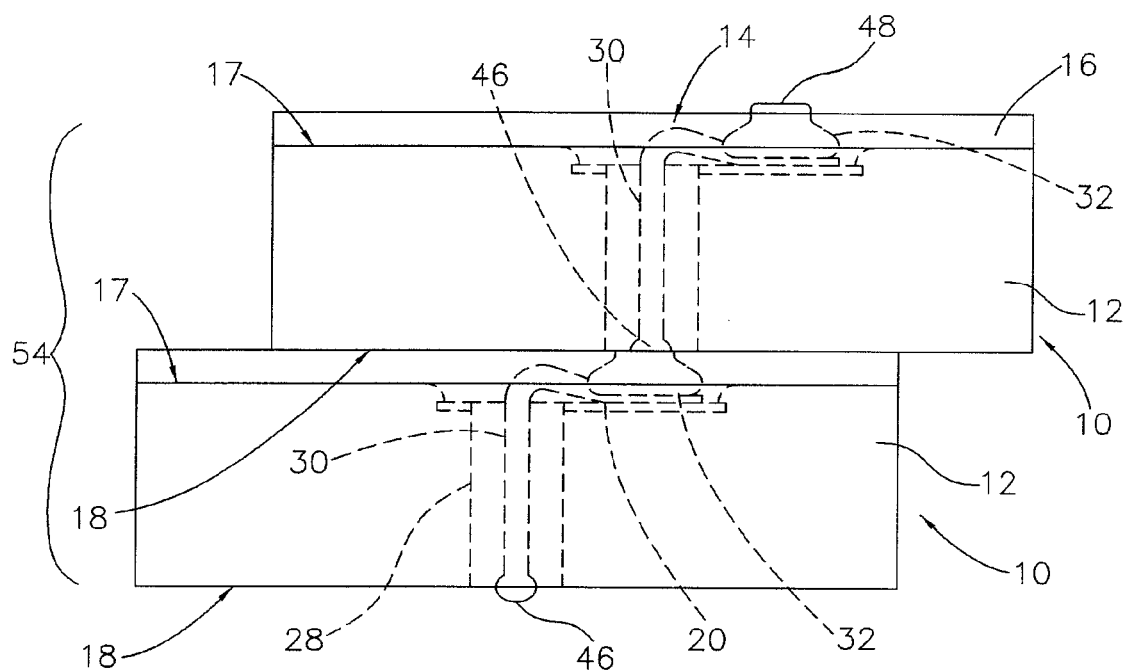
FIG. 3A is a schematic side elevation view of a stacked system fabricated using two of the semiconductor components of FIGS. 1A-1C in a circuit side to back side orientation.

Referring to FIG. 3A, a stacked system 54 includes two semiconductor components 10 stacked in a circuit side 17 to back side 18 configuration. In addition, the ball contact 46 on the upper semiconductor component 10 is bonded to the bonding member 32 on the lower semiconductor component 10 using a suitable bonding process such as a gold to gold diffusion bond, a reflow bond, or a conductive polymer bond, such as an anisotropic conductive film (ACF) to be hereinafter described. In the stacked system 54, the polymer layer 16 on the lower semiconductor component 10 provides a planar surface for stacking. In addition, either the ball contacts 46 on the lower semiconductor component 10, or the bonding members 32 on the upper semiconductor component 10, can be configured as terminal contacts for the stacked system 54. Alternately, separate terminal contacts, such as solder balls, can be formed on the semiconductor components 10 in electrical communication with the ball contacts 46 or the bonding members 32. Previously incorporated application Ser. No. 11/296,057 discloses methods for forming terminal contacts.

Figure 3B:
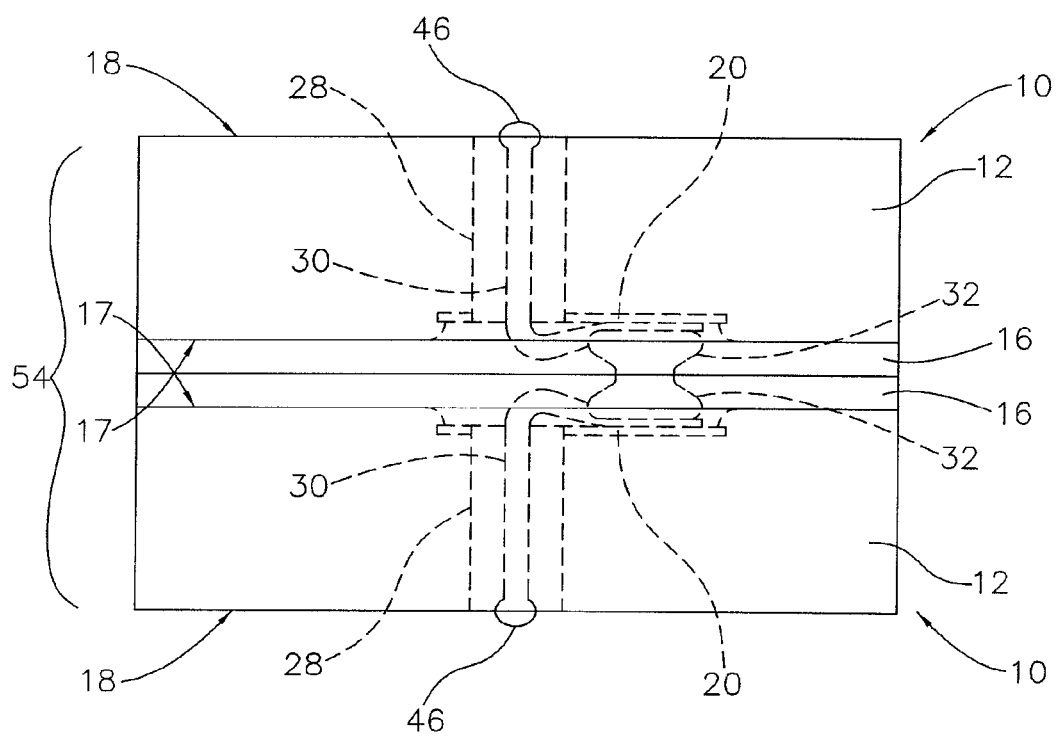
FIG. 3B is a schematic side elevation view of a stacked system fabricated using two of the semiconductor components of FIGS. 1A-1C in a circuit side to circuit side orientation.

Referring to FIG. 3B, a stacked system 56 includes two semiconductor components 10 stacked in a circuit side 17 to circuit side 17 configuration. In addition, the bonding members 32 on the components 10 are bonded to one another using a suitable bonding process such as a gold to gold diffusion bond, a reflow bond, or a conductive polymer bond such as an anisotropic conductive film (ACF) to be hereinafter described. In the stacked system 56, the polymer layers 16 on both components 10 provide planar surfaces for stacking. In addition, the ball contacts 46 can be configured as terminal contacts for the stacked system 56. Alternately, separate terminal contacts such as solder balls can be formed on the semiconductor components 10 in electrical communication with the ball contacts 46. Previously incorporated application Ser. No. 11/296,057 discloses additional semiconductor components and stacked systems that can be fabricated using semiconductor components with through wire interconnects.

Figure 4A:
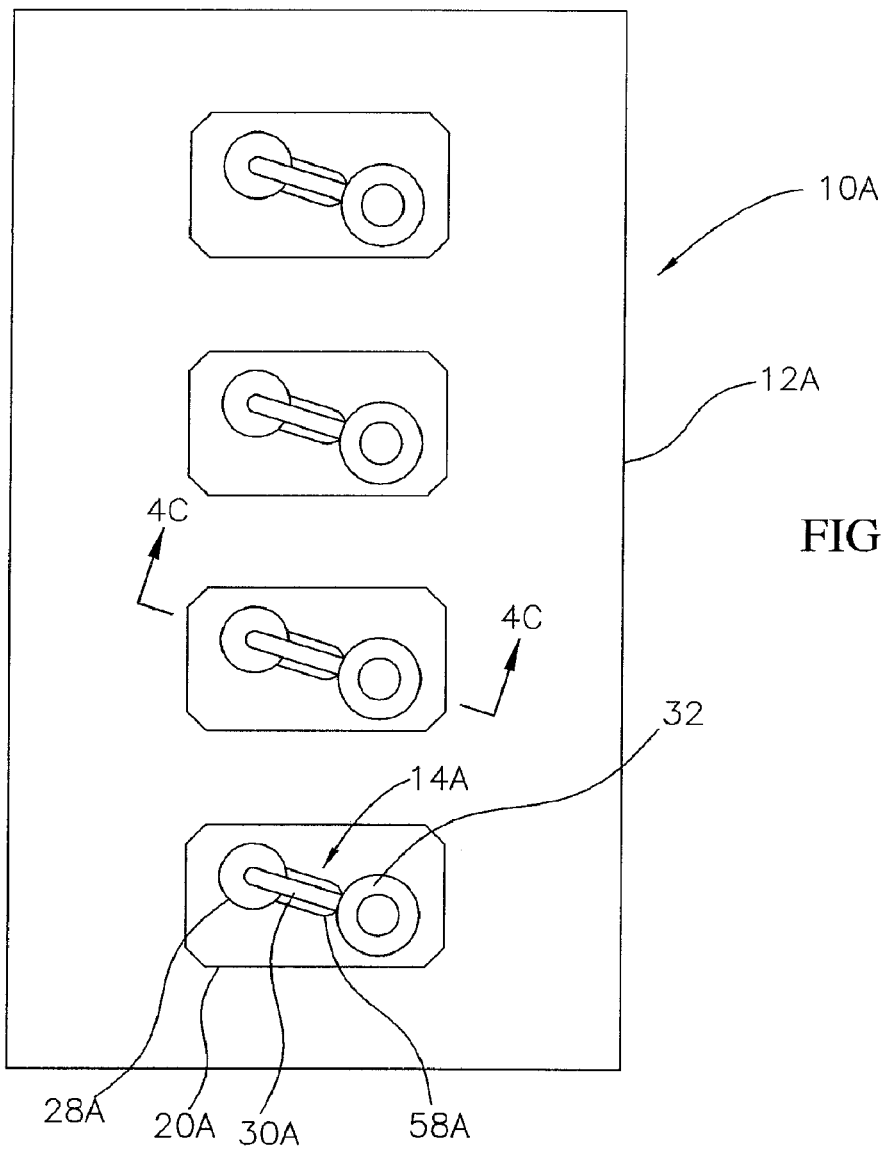
FIG. 4A is a schematic plan view of an alternate embodiment semiconductor component having through wire interconnects (TWI) with polymer members.
Figure 4B:
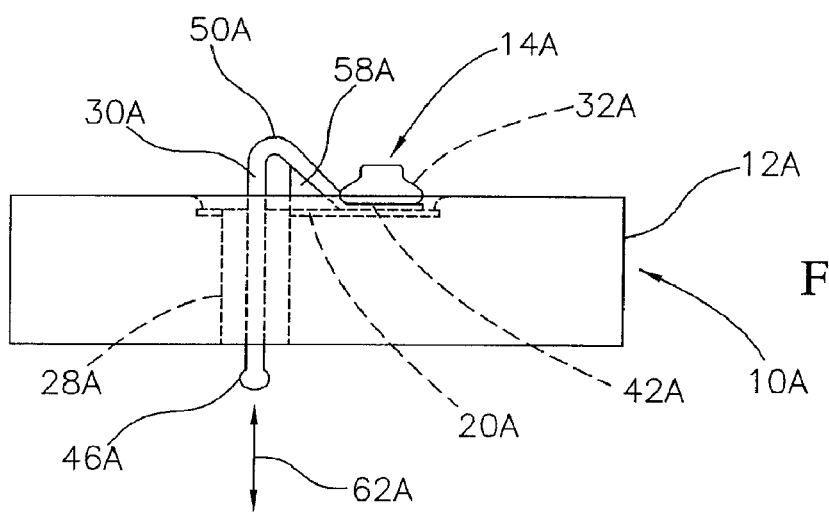
FIG. 4B is a schematic side elevation view of the semiconductor component of FIG. 4A.

Referring to FIGS. 4A-4E, an alternate embodiment semiconductor component 10A is illustrated. The semiconductor component 10A includes a substrate 12A having a plurality of substrate contacts 20A and through wire interconnects 14A. Each through wire interconnect 14A includes a via 28A, a wire 30A having a loop portion 50A, and a bonding member 32A bonding the wire 30A to the substrate contact 20A, substantially as previously described for through wire interconnects 14 (FIG. 1A). In this embodiment the wire 30A and the contact ball 46A (second contact) on the wire 30A are free to move in the z direction as indicated by arrow 62A (FIG. 4C).

The through wire interconnects 14A (FIG. 4C) also include polymer members 58A (FIG. 4C) on the substrate contacts 20A (FIG. 4C), which support the loop portions 50A (FIG. 4C) of the wires 30A (FIG. 4C). The polymer members 58A (FIG. 4C) can have a compliant, resilient or compressible configuration. In addition, the loop portions 50A (FIG. 4C) of the wires 30A (FIG. 4C) can be embedded in the polymer members 58A (FIG. 4C) or supported by grooves or other features on the polymer members 58A (FIG. 4C). Alternately, the polymer members 58A (FIG. 4C) can have a relatively rigid configuration with the wires 30A (FIG. 4C) supported by the surfaces thereof. In either case, the polymer members 58A (FIG. 4C) protect, and maintain the planarity and the shapes of the loop portions 50A (FIG. 4C) of the wires 30A (FIG. 4C). The polymer members 58A (FIG. 4C) also allow the tips of the loop portions 50A (FIG. 4C) to be used as contacts for the through wire interconnects 14A (i.e., first contacts as previously described, or in some cases third contacts in combination with the first contacts and the second contacts). In this case, the loop portions 50A (FIG. 4C) can have a first height H1 (FIG. 4C) on the substrate 12A, which is greater than a second height H2 (FIG. 4C) of the bonding members 32A (FIG. 4C) on the substrate 12A.

Figure 6A:
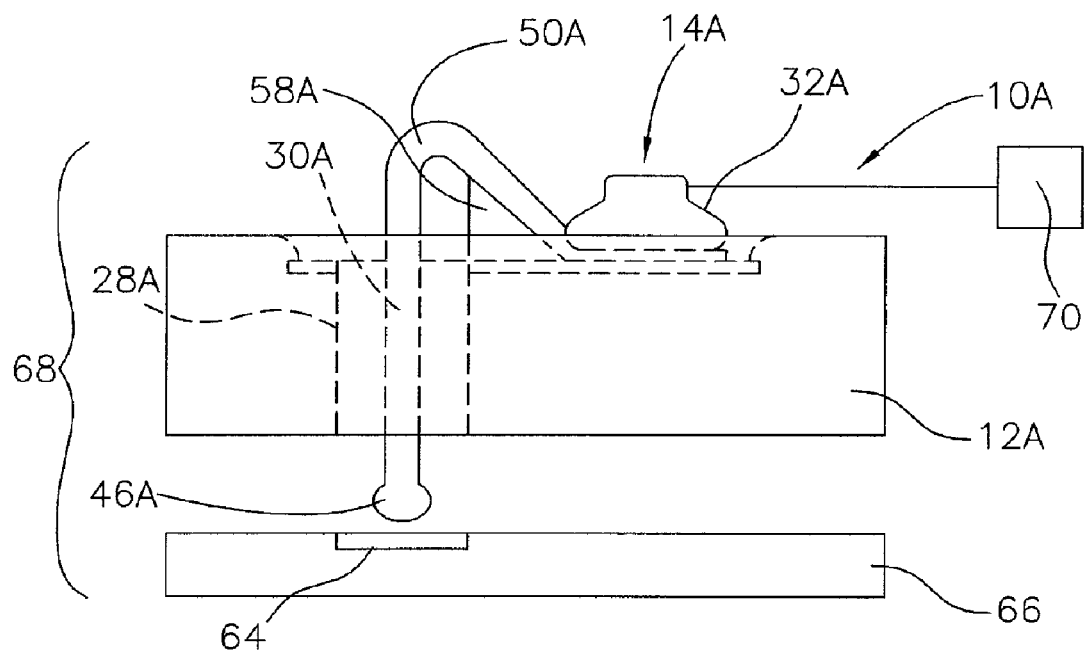
FIGS. 6A and 6B are schematic cross sectional views of a test system incorporating the semiconductor component of FIGS. 4A-4E.

The polymer members 58A (FIG. 4C) can also be configured to provide a spring force which allows the contact balls 46A (FIG. 4C) to flex in the z-direction during electrical engagement of a test contact 64 (FIG. 6A) on a device under test 66 (FIG. 6A). The device under test 66 (FIG. 6A) can comprise a semiconductor die or wafer, or an array of semiconductor dice on a semiconductor wafer or portion thereof. The polymer member 58A (FIG. 4C) also allow the tips of the loop portions 50A (FIG. 4C) of the wires 30A (FIG. 4C) to flex during electrical engagement of mating contacts. The sidewalls of the vias 28A (FIG. 4C) can also be covered with a low friction insulating layer 34A (FIG. 4C), such as parylene, which allows the wires 30A to move freely within the vias 28A (FIG. 4C) during electrical engagement. The wires 30A can also include polymer layers such as the previously described insulated bonding wire from Micro Bond of Canada. In this case the polymer layers on the wires 30A (FIG. 4C) can help lower friction between the wires 30A (FIG. 4C), and the vias 28A (FIG. 4C). In addition, the wires 30A (FIG. 4C) can be long enough to space the contact balls 46A (FIG. 4C) from the substrate 12A (FIG. 4C) to allow movement during electrical engagement.

The polymer members 58A (FIG. 4C) can comprise a polymer material such as silicone, polyimide, epoxy or mold compound having a selected size, shape and durometer. In addition, the polymer members 58A (FIG. 4C) can be formed with required sizes and shapes using a molding process, a deposition process, or a screen printing process. In the illustrative embodiment, each through wire interconnect 14A (FIG. 4C) has an associated polymer member 58A (FIG. 4C). However, a polymer member can be formed to support several through wire interconnects 14A, such as all of the through wire interconnects 14A on a row of substrate contacts 20A (FIG. 4C). Also in the illustrative embodiment, the polymer members 58A (FIG. 4A) are tapered to conform to the natural shape of the wire loops 50A (FIG. 4C). However, the polymer members 58A (FIG. 4A) can have any desired shape. The polymer members 58A (FIG. 4A) can also have any desired footprint such as a circular or polygonal, and any desired height. In addition, the polymer members 58A can include grooves, ridges, indentations or other features, which support the loop portions 50A of the wires 30A. As another alternative the polymer members 58A can at least partially encapsulate or surround the wire loops 50A (FIG. 4C)

As shown in FIGS. 4D and 4E, the contact balls 46A, and the tips of the loop portions 50A as well, can include wear resistant outer layers 60A, which coat the surfaces of the wires 30A (FIG. 4C). For example, the wires 30A (FIG. 4C) can comprise gold, and the outer layers 60A (FIGS. 4D and 4E) can comprise nickel, tungsten or a conductive polymer having metal particles therein. In addition to providing wear resistant surfaces, the outer layers 60A can also enhance oxide and contaminant penetration for making low resistance, temporary or permanent electrical connections.

Referring to FIG. 5, an alternate embodiment 2× semiconductor component 10B includes through wire interconnects 14B constructed substantially as previously described for the semiconductor component 10A (FIG. 4C). As such, the semiconductor component 10B includes polymer members 58B which support loop portions 50B of the through wire interconnects 14B. The semiconductor component 10B also includes a first polymer layer 16B-1, which encapsulates the circuit side 17B of the semiconductor substrate 12B and substantially encapsulates the loop portions 50B of the through wire interconnects 14B. The first polymer layer 16B-1 also fills the via 28B and secures the wire 30B in the vias 28B, substantially as previously described with the polymer material 36 (FIG. 1C). However, surfaces of the loop portions 50B of the through wire interconnects 14B remain exposed, and function as contacts (first contacts) for the through wire interconnects 14B proximate to the circuit side 17B. As with the previous embodiment, these contacts can be coated with a wear resistant or oxide penetrating material such as nickel, or a conductive polymer having metal particles. The semiconductor component 10B also includes a second polymer layer 16B-2, which encapsulates the back side 18B of the semiconductor substrate 12B, and substantially encapsulates the ball contacts 46B of the through wire interconnects 14B. However, surfaces of the ball contacts 46B can remain exposed, to function as contacts (second contacts) for the through wire interconnects 14B proximate to the back side 18B.

Figure 6B:
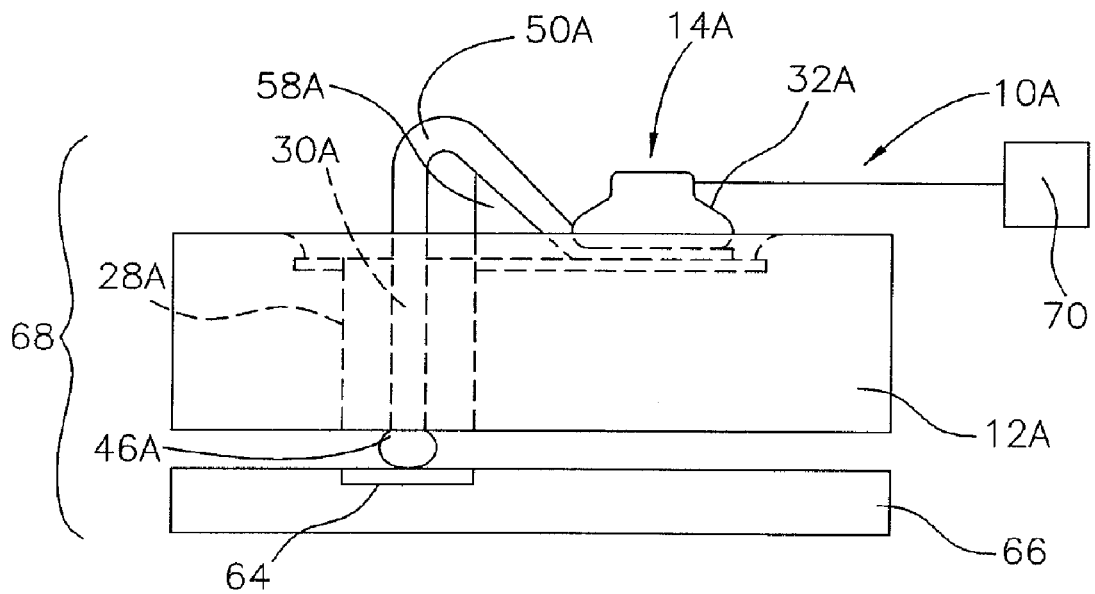

Referring to FIGS. 6A and 6B, a test system 68 incorporating the semiconductor component 10A is illustrated. In the test system 68, the semiconductor component 10A functions as an interconnect component for making temporary electrical connections with a device under test 66. For example, the device under test 66 can comprise a semiconductor wafer, in which case the semiconductor component 10A would perform the same function as a probe card. Alternately, the device under test 66 can comprise a singulated semiconductor die or semiconductor package. In this case the semiconductor component 10A can be contained in a test fixture, substantially as described in U.S. Pat. No. 5,519,332 entitled "Carrier For Testing An Unpackaged Semiconductor Die", which is incorporated herein by reference.

As shown in FIG. 6A, the device under test 66 includes a plurality of test contacts 64 that are initially aligned with the ball contacts 46A of the through wire interconnects 14A. Alignment can be accomplished using optical or mechanical alignment techniques that are known in the art. As also shown in FIG. 6A, the through wire interconnects 14A are placed in electrical communication with test circuitry 70, which is configured to apply test signals to the device under test 66. Previously incorporated application Ser. No. 11/296,057 discloses various methods and structures for placing the through wire interconnects 14A into electrical communication with the test circuitry 70.

As shown in FIG. 6B, following alignment, either the semiconductor component 10A, or the device under test 66, (or both) can be moved in the z-direction to place the ball contacts 46A of the through wire interconnects 14A into contact with the test contacts 64. In addition, the semiconductor component 10A and the device under test 66 can be held together using a biasing force generated by a test fixture, a wafer prober or other testing device known in the art. This establishes temporary electrical communication between the ball contacts 46A of the through wire interconnects 14A and the test contacts 64. As the wire 30A is free to move in the z-direction during electrical engagement, variations in the planarity and location of the test contacts 64 can be accommodated by movement of the ball contacts 46A. In addition, the polymer members 58A provide spring forces for biasing the ball contacts 46A against the test contacts 64 and for returning the ball contacts 46A to their original locations following the test process. This allows the ball contacts 46A to be used to align with and test another device under test 66. Further, the outer layers 60A (FIG. 4D) on the ball contacts 46A penetrate oxide layers on the test contacts 64 to provide low resistance temporary electrical connections.

Figure 7:
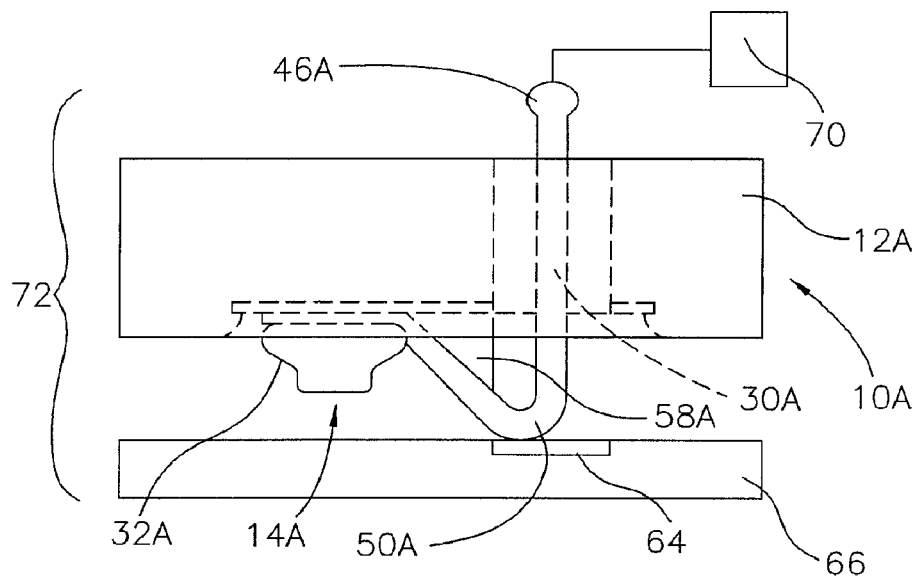
FIG. 7 is a schematic cross sectional view of an alternate embodiment test system incorporating the semiconductor component of FIGS. 4A-4E.

Referring to FIG. 7, an alternate embodiment test system 72 incorporating the semiconductor component 10A is illustrated. In the test system 72, the semiconductor component 10A functions as an interconnect component for making temporary electrical connections with a device under test 66 substantially as previously described for the test system 68 (FIG. 6A). However, in the test system 72 the loop portions 50A of the wires 30A, rather than the ball contacts 46A, make the temporary electrical connections with the test contact 64 on the device under test 66. In addition, the polymer members 58A provide spring forces for maintaining the location and planarity of the loop portions 50A. The polymer members 58A also provide spring forces for biasing the loop portions 50A into the test contact 64 under a biasing force generated by a test fixture, a wafer prober or other testing device known in the art. Essentially the same test system 72 (FIG. 7) can be constructed using the semiconductor component 10B (FIG. 5) in place of the semiconductor component 10A (FIG. 7). In this case, the polymer layer 16B-1 (FIG. 5) can be relatively compressible to allow movement of the loop portions 50A during electrical engagement.

Figure 8:
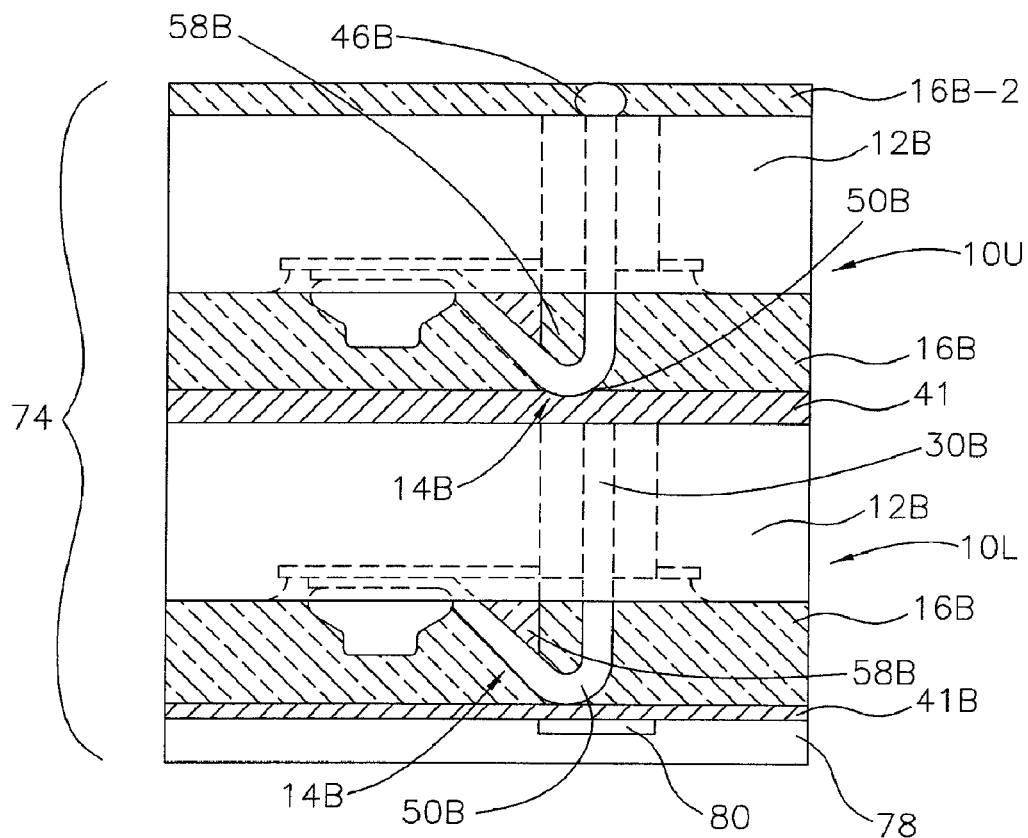
FIG. 8 is a schematic cross sectional view of module system incorporating the semiconductor component of FIG. 5.

Referring to FIG. 8, an alternate embodiment module system 74 incorporating two semiconductor components 10U, 10L having through wire interconnects 14B is illustrated. The semiconductor components 10U, 10L are substantially similar to the semiconductor component 10B of FIG. 5. Although only two semiconductor components 10U, 10L are illustrated, it is to be understood that the module system 74 can include any number of stacked semiconductor components (e.g., two to twenty). The claims to follow thus refer to at least two stacked semiconductor components. In addition, the semiconductor components 10U, 10L are attached and interconnected using an anisotropic conductive film 41 which covers the back side of the lower semiconductor component 10L, and the circuit side of the upper semiconductor component 10U. However, the semiconductor components 10U, 10L can be attached and interconnected using an adhesive bond and a conductive bond between mating elements.

The module system 74 (FIG. 8) includes a module substrate 78, such as a circuit board, having a plurality of electrodes 80, which connect to other electrical elements and circuits on the module substrate 78. In addition, the loop portions 50B of the through wire interconnects 14B on the lower semiconductor component 10L are bonded to the electrodes 80 on the support substrate 78 using a bonded connection as previously described. The loop portions 50B of the through wire interconnects 14B on the lower semiconductor component 10L can be bonded to the electrodes 80 on the module substrate 78 using bonded connections such as solder fillets, conductive adhesive layers, reflow bonds, or diffusion bonds. As previously described, the loop portions 50B are supported by the polymer members 58B, which maintain their locations and planarity. As shown in FIG. 8, the polymer layer 16B on the lower semiconductor component 10L also spaces and electrically insulates the lower semiconductor component 10L from the module substrate 78. Alternately, these electrical connections can be made using an anisotropic conductive film 41B placed between the polymer layer 16B on the lower semiconductor component 10L and the substrate 78.

As shown in FIG. 8, the module system 74 also includes the anisotropic conductive film 41 which electrically connects the loop portions 50B of the through wire interconnects 14B on the upper semiconductor component 10U with the through wire interconnects 14B on the lower semiconductor component 10L. In the illustrative embodiment, the ball contacts 46B of the through wire interconnects 14B on the lower semiconductor component 10L have been eliminated, such that electrical contact is through the anisotropic conductive film 41 to the ends of the wires 30B of the through wire interconnects 14B on the lower semiconductor component 10L. The anisotropic conductive film 41 and the anisotropic conductive film 41B can comprise a thermally and electrically conductive Z-axis film adhesive. On suitable Z-axis film adhesive is manufactured by Btechcorp of Brentwood, Tenn. under the product description IOB-3.

As also shown in FIG. 8, the polymer layer 16B on the upper semiconductor component 10U contacts the anisotropic conductive film 41. Further, the polymer members 58B on the upper semiconductor component 10U support the loop portions 50B and their points of contact with the anisotropic conductive film 41. In addition, the ball contacts 46B of the through wire interconnects 14B on the upper semiconductor component 10U provide terminal contacts from the outside to the module system 74. Further, the polymer layer 16B-2 on the back side of the upper semiconductor component 10U provides electrical insulation for the upper semiconductor component 10U.

Figure 9A:
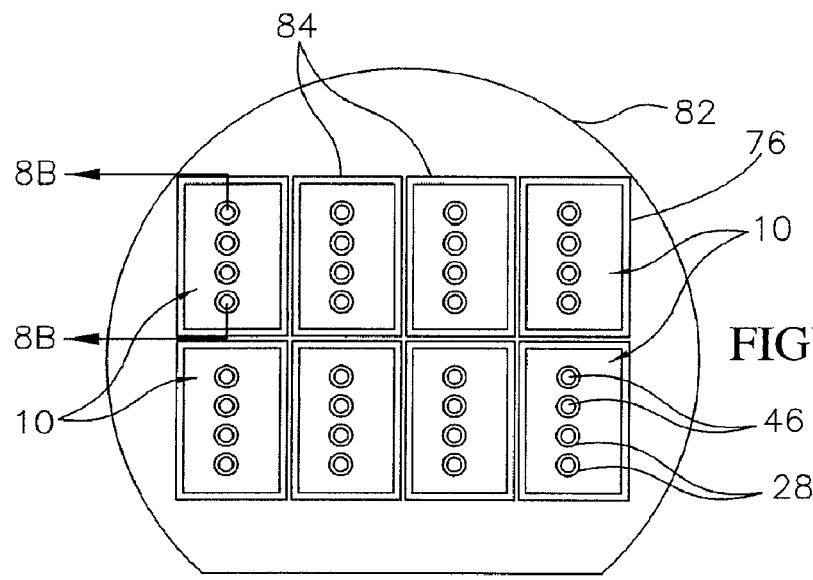
FIG. 9A is a schematic plan view of a wafer system incorporating multiple semiconductor components of FIG. 1A-1C bonded to a semiconductor wafer.
Figure 9B:
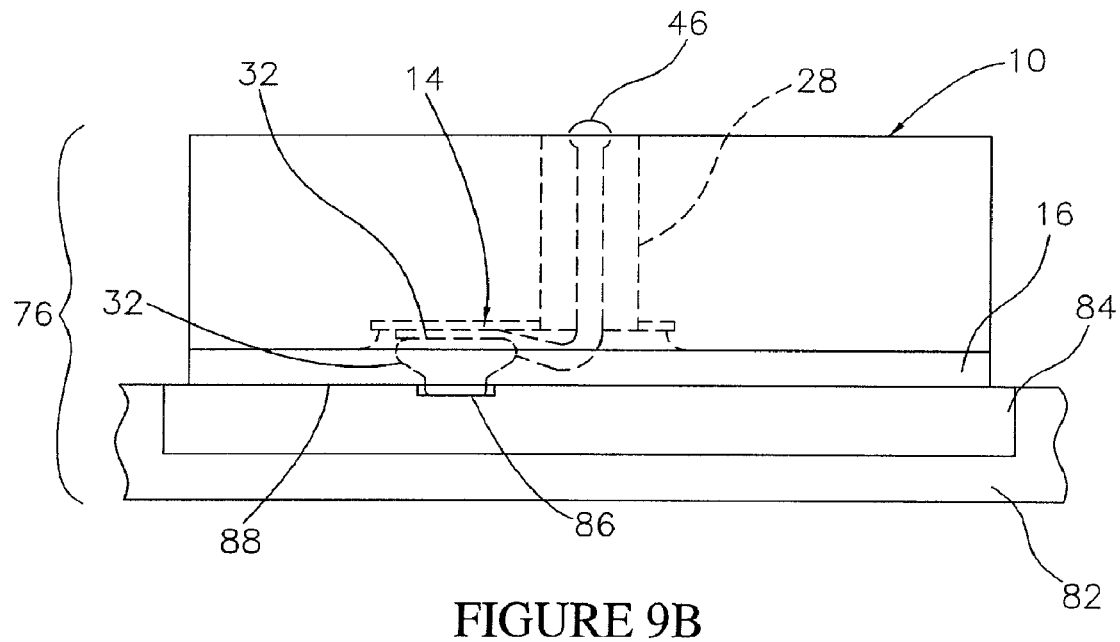
FIG. 9B is an enlarged schematic cross sectional view taken along section line 9B-9B of FIG. 9A illustrating a single semiconductor component bonded to the semiconductor wafer.

Referring to FIGS. 9A-9B, a wafer system 76 includes a semiconductor wafer 82 and multiple singulated semiconductor components 10 (FIGS. 1A-C) bonded to the semiconductor wafer 82. Alternately, in place of the semiconductor components 10, the wafer system 76 can include any other previously described alternate embodiment semiconductor component. The semiconductor wafer 82 includes a plurality of semiconductor dice 84 with a desired electrical configuration having die contacts 86 (FIG. 9B) in electrical communication with the integrated circuits contained on the semiconductor dice 84. For illustrative purposes the semiconductor dice 84 are illustrated as having peripheral outlines (footprints) that are about the same size but slightly larger than the peripheral outlines (footprints) of the semiconductor components 10.

As shown in FIG. 9B, the bonding members 32 of the through wire interconnects 14 on the semiconductor components 10 are bonded to the die contacts 86 on the semiconductor dice 84 contained on the semiconductor wafer 82. In addition, the polymer layers 16 on the semiconductor components 10 provide planar surfaces, which electrically insulate the components 10 from the semiconductor dice 84. In addition, adhesive layers 88 can be used to attach the semiconductor components 10 to the semiconductor wafer 82. If desired the adhesive layers 88 can comprise a conductive adhesive, such as the previously described Z-axis film adhesives to provide electrical conductivity as well as mechanical attachment. Further, the ball contacts 46 on the semiconductor components 10 provide outside electrical connection points (second contacts) to the semiconductor components 10 and the corresponding semiconductor dice 84 on the semiconductor wafer 82. Alternately, the semiconductor components 10 can be flipped and the ball contacts 46 bonded to the die contacts 86 on the semiconductor dice 84. In this case, the bonding members 32 would be on outside, and could provide outside electrical connection points (second contacts). As another alternative, the loop portions 50A (FIG. 4B) or 50B (FIG. 5) of semiconductor components 10A (FIG. 4B) or 10B (FIG. 5) could be bonded to the die contacts 86 (FIG. 9B) substantially as shown in FIG. 8.

Figure 10:
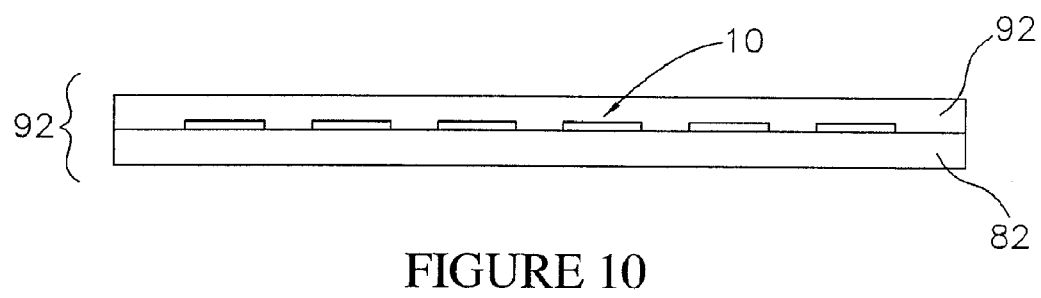
FIG. 10 is a schematic side elevation view of a wafer to wafer system incorporating semiconductor components having through wire interconnects (TWI)

Referring to FIG. 10, a wafer to wafer system 90 is substantially similar to the wafer system 76 (FIGS. 9A-9B) but the semiconductor components 10 are contained on a second semiconductor wafer 92. Alternately, in place of the semiconductor components 10, the wafer to wafer system 90 can include any of the previously described alternate embodiment semiconductor components contained on the second semiconductor wafer 92.

Referring to FIGS. 11A-11D and 12A-12C, a method for fabricating the semiconductor component 10 (FIG. 1A) is illustrated. Essentially the same method can be used to fabricate any of the previously described alternate embodiments of the semiconductor component 10. In the illustrative embodiment, the method comprises a wafer level fabrication method. However, it is to be understood that the method can also be performed on singulated components with a die level fabrication method.

Figure 11A:
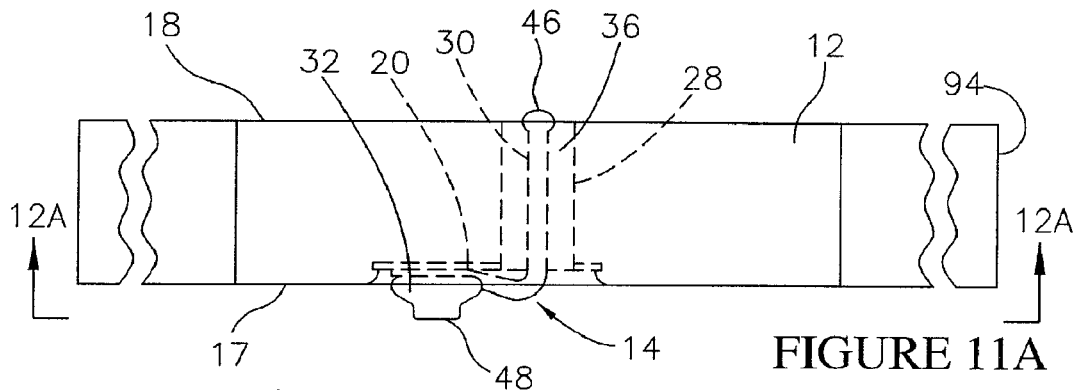
FIGS. 11A-11D are schematic side elevation views illustrating steps in a film assisted molding method for fabricating the semiconductor component of FIGS. 1A-1C.
Figure 12A:
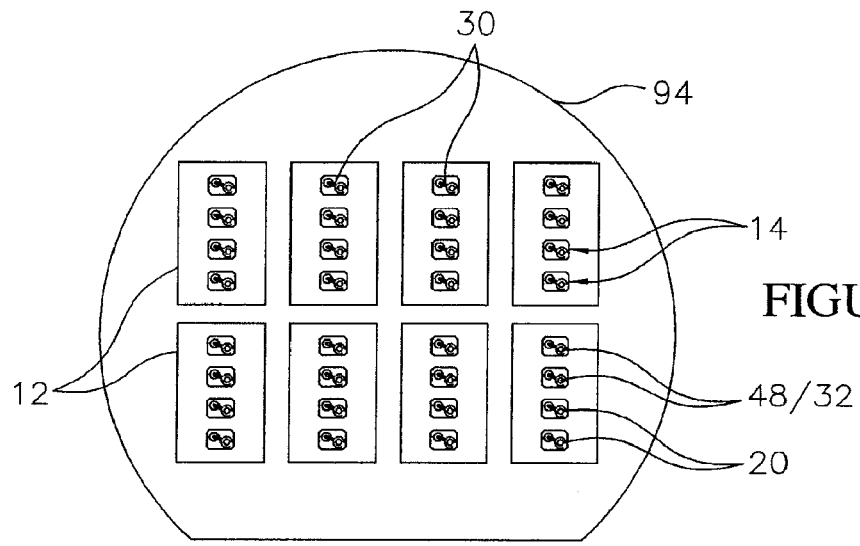
FIG. 12A is an enlarged schematic view taken along line 12A-12A of FIG. 11A.

Initially, as shown in FIGS. 11A and 12A, a component substrate 94 containing a plurality of the semiconductor substrates 12 is provided. The component substrate 94 can comprise a semiconductor wafer or a portion of a wafer containing semiconductor dice. Alternately the component substrate 94 can comprise a panel containing semiconductor packages, such as molded array packages. In addition, the component substrate 94 can have a desired thickness, such as the previously described thickness T (FIG. 1C) for the semiconductor substrates 12.

As shown in FIG. 11A, a plurality of through wire interconnects 14 are formed on the semiconductor substrates 12 contained on the component substrate 94. Previously incorporated U.S. application Ser. Nos. 11/102,408 and 11/296, 057 describe methods and systems for fabricating the through wire interconnects 14. Each through wire interconnect 14 includes the via 28 through the substrate contact 20 and the semiconductor substrate 12, the wire 30 in the via 28 bonded to the substrate contact 20, and the ball contact 46 (second contact) on the wire 30. Each through wire interconnect 14 also includes the bonding member 32 (second contact) on the substrate contact 20 and the wire 30 having the tip portion 48 forming a first contact substantially as previously described. Alternately, in place of the through wire interconnects 14, any of the previously described alternate embodiment of through wire interconnects can be fabricated on the semiconductor substrates 12 contained on the component substrate 94.

Each through wire interconnect 14 can also include the polymer material 36 (FIG. 11A) in the via 28 substantially as previously described. The polymer material 36 can be deposited into the via 28 and around the wire 30 in viscous form and then cured to harden. In addition, excess polymer material, such as material on the circuit side 17 of the semiconductor substrate 12 could then be removed using a spacer etch process with a suitable etchant. Alternately, the polymer material 36 can be deposited into the via 28 in viscous form prior to placement of the wire 30. In this case, the wire 30 would be pushed into the viscous polymer material 36, which would then be cured to harden around the wire 30. This would eliminate the need for a spacer etch to remove excess material. In addition, the via could initially be a non vented counterbore to prevent the egress of liquids or slurries during a subsequent back side thinning step, as described in previously incorporated U.S. application Ser. Nos. 11/102,408 and 11/296,057. The polymer material 36 (FIG. 11A) can be deposited using a suitable deposition process such as screen printing, stenciling or deposition using a nozzle or a material dispensing system.

The polymer material 36 (FIG. 11A) can comprise an electrically insulating curable polymer, such as a polyimide, epoxy, a silicone or a mold compound. Also, the polymer material 36 can include fillers, such as silicates, configured to reduce the coefficient of thermal expansion (CTE) and adjust the viscosity of the dielectric material. Suitable curable polymers are manufactured by Shinitsu of Japan, and Dexter Electronic Materials of Rocky Hill, Conn. Following curing, the polymer material 36 provides a potting structure which secures and electrically insulates the wire 30 in the via 28. Alternately, for some applications, the polymer material 36 in the via 28 can comprise an electrically conductive material.

Figure 11B:
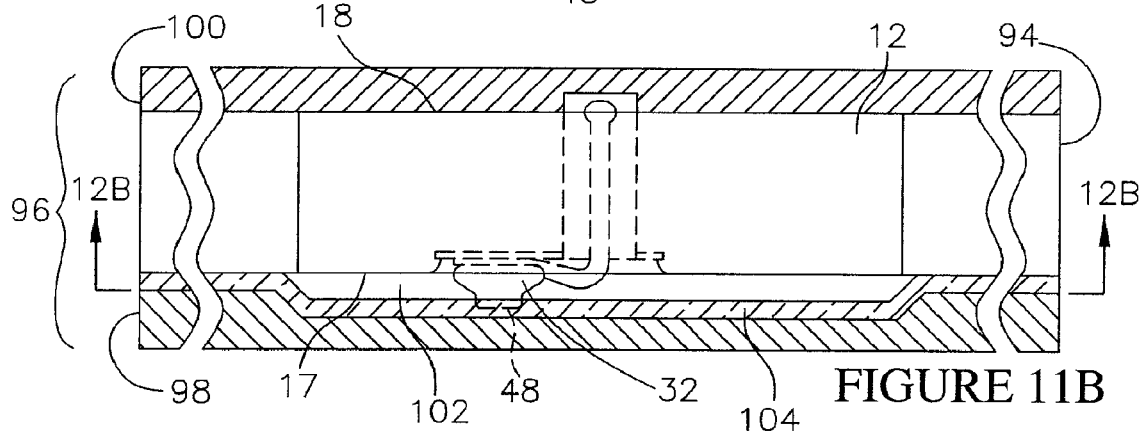

Next, as shown in FIG. 11B, a film assisted molding system 96 is provided. Suitable film assisted molding systems are available from Boschman Technologies b.v. Nieuwgraaf, The Netherlands, and by Yamada of Japan. The film assisted molding system 96 allows ultra thin semiconductor components to be encapsulated on one or more surfaces. The film assisted molding system 96 includes a first mold 98 for supporting the circuit sides 17 of the semiconductor substrates 12 on the component substrate 94, and a second mold 100 for supporting the back sides 18 of the semiconductor substrates 12 on the component substrate 94. The first mold 98 includes a plurality of mold cavities 102 configured to mold the polymer layer 16 (FIG. 1B) on the semiconductor substrates 12. In the illustrative embodiment, the components 10 (FIG. 11D) are molded separately, which is referred to as a matrix substrate configuration. Alternately, multiple components can be molded together, which is referred to as an array substrate configuration.

Figure 11D:
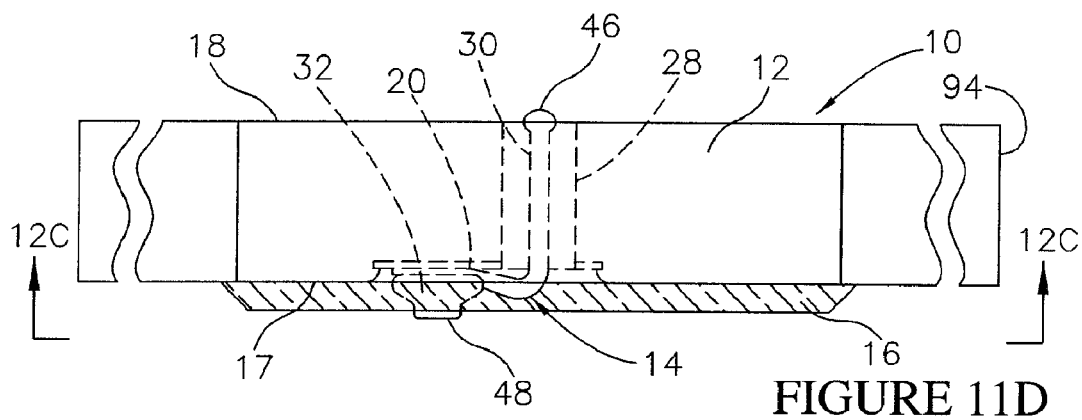
Figure 12B:
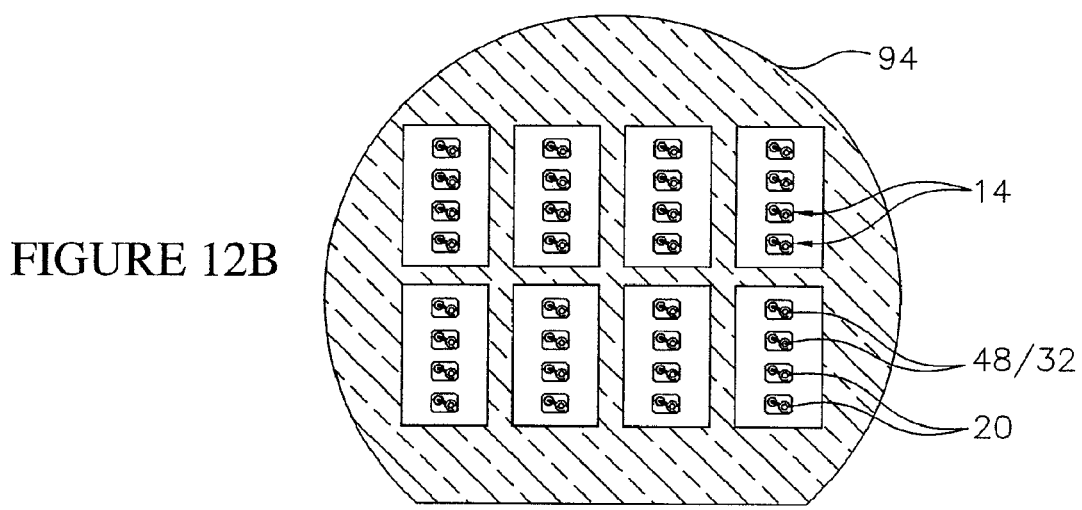
FIG. 12B is an enlarged schematic cross sectional view taken along line 12B-12B of FIG. 11B.

As shown in FIGS. 11B and 12B, the first mold 98 includes a mold film 104 which follows the contour of the mold cavities 102. The first mold 98, the mold film 104 and the mold cavities 102 are sized and shaped such that the tip portions 48 of the bonding members 32 become embedded in the mold film 104 and protected from the subsequent molding step. These elements are also configured to form the polymer layers 16 (FIG. 11D) with a selected thickness. A representative range for the selected thickness can be from 10 µm to 500 µm.

Figure 11C:
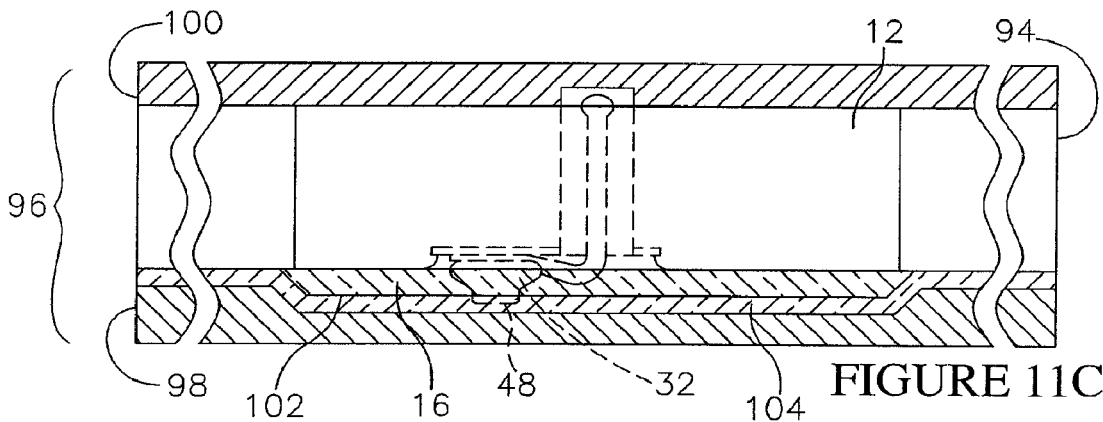

Next, as shown in FIG. 11C, a molding step is performed in which a plastic molding material, such as a thermoset polymer, is injected into the mold cavities 102 to form the polymer layers 16 on the circuit sides 17 of the semiconductor substrates 12. However, during the molding step, the tip portions 48 of the bonding members 32 are protected by the mold film 104 from the plastic molding material.

Figure 12C:
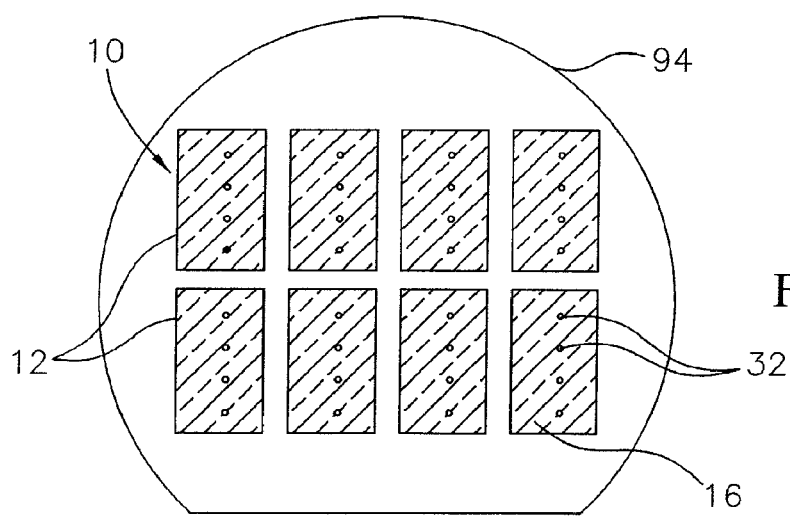
FIG. 12C is an enlarged schematic view taken along line 12C-12C of FIG. 11D.

As shown in FIGS. 11D and 12C, the polymer layers 16 encapsulate the circuit sides 17 of the semiconductor substrates 12. The polymer layers 16 can be made with planar surfaces and precise thicknesses. Similarly, the tip portions 48 of the bonding members 32 can project from the polymer layers 16 by a selected distance. A representative range for this selected distance can be from 10 µm to 75 µm. As only one side of each semiconductor substrate 12 is encapsulated, the semiconductor components 10 are referred to as having a 1× configuration. However, essentially the same molding process can be used to form a 2× or a 6× component. For example, essentially the same molding process can be used to encapsulate the edges and back sides 18 of the semiconductor substrates 12, while leaving tip portions of the ball contacts 46 (FIG. 11D) exposed. As will be further explained, essentially the same molding process can also be used to form both the polymer layers 16 for encapsulation, and the polymer material 36 (FIG. 1C) in the vias 28 (FIG. 1C).

Essentially the same molding process can also be used to have selected areas on the component substrate 94, or on the individual semiconductor substrates 12, unencapsulated by the polymer layers 16. For example, the pixel array of an imager component can remain unencapsulated. In this case, the molding film 104 can be configured to cover or "gasket off" the pixel arrays, or other selected areas of the semiconductor substrates 12, from being encapsulated by the mold compound. As another alternative, "blocks" or "pedestals" of a compressible polymer, such as silicone, can be placed in a selected pattern on the molding film 104, or on the component substrate 94. During the molding step, the "blocks" or "pedestals" would be compressed between the component substrate 94 and the molding film 104. Where the "blocks" or "pedestals" are in intimate contact with an area or an element (e.g., loop portions 50A-FIG. 4B) on the component substrate 94, the area or element would be free of the plastic molding material. The "blocks" or "pedestals" could then be removed after the molding step. Alternately, the "blocks" or "pedestals" could be left attached to the component substrate 94, and used to attach lenses over the pixel arrays of imager components.

Following the molding step, a singulating step, such as sawing, scribing, liquid jetting, or laser cutting through a liquid, can be performed to singulate the semiconductor components 10 from the component substrate 94 with desired footprints, such as chip scale outlines. Alternately, a wafer sized component can be provided which contains multiple unsingulated semiconductor substrates 12.

Figure 13A:
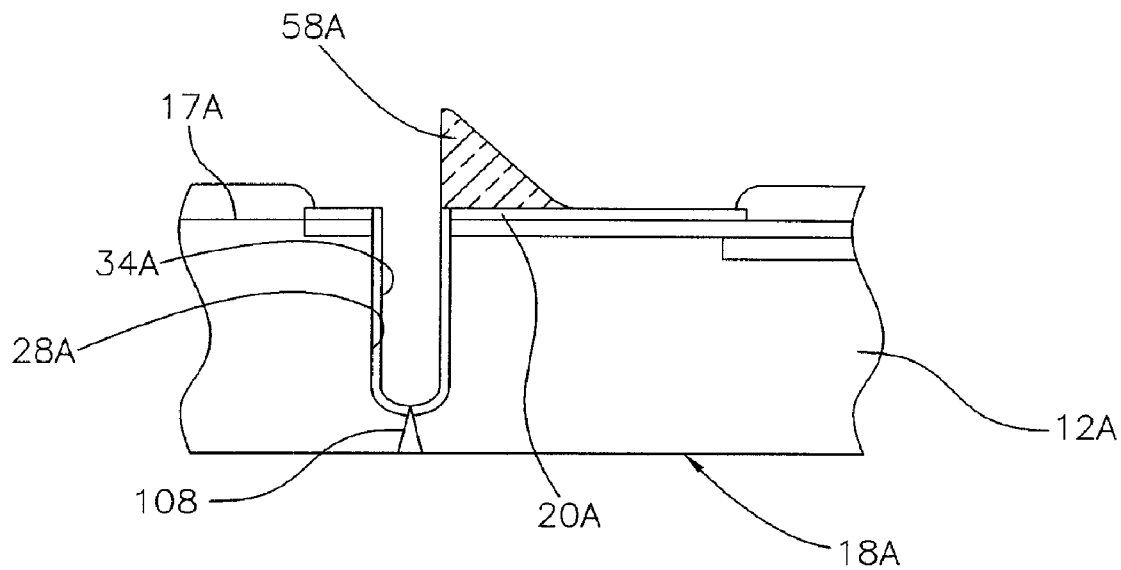
FIGS. 13A-13B are schematic cross sectional views showing steps in a method for fabricating the alternate embodiment semiconductor component of FIGS. 4A-4E.
Figure 13B:
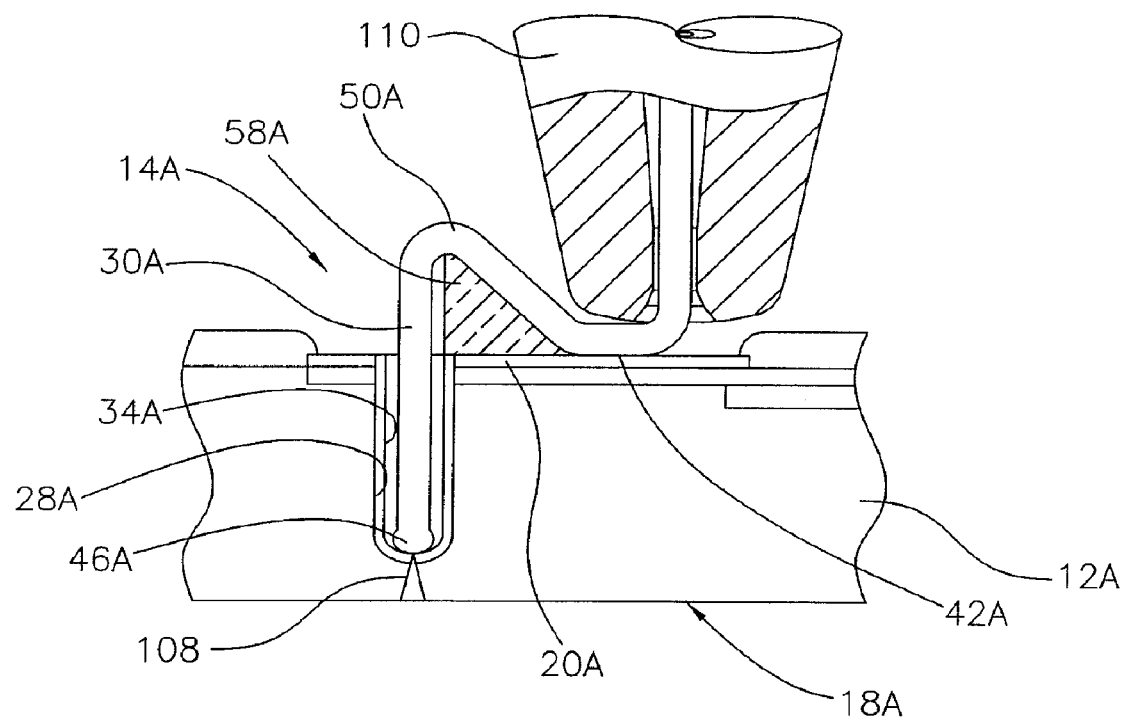

Referring to FIGS. 13A-13B, a method for fabricating the semiconductor component 10A (FIG. 4B) with through wire interconnects 14A (FIG. 4B) having polymer members 58A (FIG. 4B) is illustrated. Initially, as shown in FIG. 13A, the via 28A and the insulating layer 34A are formed in the substrate contact 20A substantially as described in previously incorporated U.S. application Ser. Nos. 11/102,408 and 11/296,057. As also described in these applications, the via 28A is initially a counterbore or blind hole having a vent opening 108. Following a wire bonding step, the back side 18A of the substrate is thinned to expose the ball contact 46A (FIG. 13B).

As also shown in FIG. 13A, the polymer members 58A can be formed on the substrate contacts 20A. The polymer members 58A can comprise a polymer material such as silicone, polyimide, epoxy or mold compound. In addition, the polymer members 58A can have a desired size, shape and durometer. Further, the polymer members 58A can be fabricated using a suitable process, such as depositing, molding or screen printing a viscous or semi viscous (B-stage) curable polymer onto the substrate contacts 20A, and if desired other portions of the circuit side 17A of the semiconductor substrate 12A. The polymer members 58A can also be formed by placing pre-formed adhesive polymer elements on the substrate contacts 28A.

Next, as shown in FIG. 13B, a wire bonder having a bonding capillary 110 can be provided. Preferably the wire bonder is configured to perform an ultra fine pitch (e.g., <65 µm) wire bonding process. Suitable wire bonders are manufactured by Kulicke & Soffa Industries Inc. of Willow Grove, Pa., and Palomar of Carlsbad, Calif. One suitable wire bonder is an "AT PREMIER" large area ball bonder manufactured by Kulicke & Soffa Industries Inc., having a total bond placement accuracy of about +/−5 µm at pitches down to about 65 µm. Bonding capillaries are available from SPT (Small Precision Tools) of Petaluma, Calif., and from Kulicke & Soffa Industries Inc.

The bonding capillary 110 (FIG. 13B) is configured to form a continuous length of bonding wire into the wire 30A (FIG. 13B) for the through wire interconnect 14A (FIG. 13B), and to form the bonded connections 42A with the substrate contacts 20A. Previously incorporated U.S. application Ser. Nos. 11/102,408 and 11/296,057 further describe the bonding step. However, in this embodiment the bonding capillary 110 is controlled such that the wires 30A follow the contour of the polymer members 58A, and have the high loop portions 50A. Further, the polymer members 58A can be in a semi-cured or B-stage condition during the bonding step, such that the loop portions 50A of the wires 30A are in effect embedded in the polymer members 58A. Further, the outside surfaces of the loop portions 50A can have outer layers 60A (FIG. 4D) formed of a wear resistant metal such as nickel. The wear resistant metal can be provided on the wires 30A from the outset, or can be plated on the loop portions 50A following the bonding step.

Following the bonding step, the bonding members 32A (FIG. 4B) can be formed on the bonded connections 42A, using a suitable process such as ball bumping, stud bumping or reflow bonding, as further described in previously incorporated U.S. application Ser. Nos. 11/102,408 and 11/296, 057. The semiconductor substrate 12A can then be thinned from the back side to expose the ball contacts 46A. However, prior to the thinning step the film assisted molding process shown in FIGS. 11A-11D and 12A-12C can be used to form polymer layers (e.g., 16B-1 in FIG. 5) as required.

Figure 14:
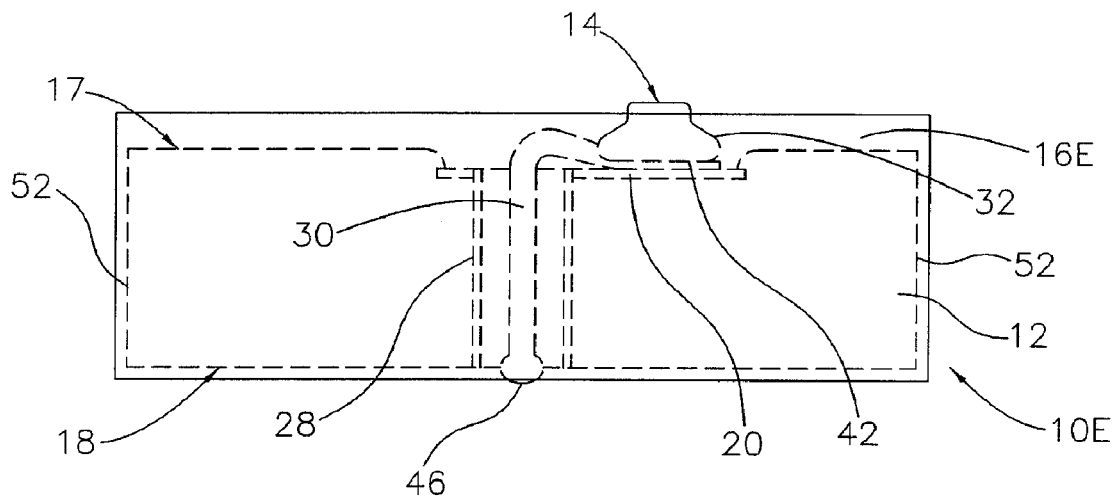
FIG. 14 is a schematic side elevation view equivalent to FIG. 1B of an alternate embodiment semiconductor component encapsulated on six sides.

Referring to FIG. 14, essentially the same film assisted molding process shown in FIGS. 11A-11D and 12A-12C, can be used to fabricate an alternate embodiment encapsulated semiconductor component 10E. The encapsulated semiconductor component 10E includes a polymer layer 16E which encapsulates the circuit side 17, the back side 18, and the sides 52 of the semiconductor substrate 12. In this embodiment, the polymer layer 16E encapsulates all six sides of the semiconductor substrate 12, and the component 10E is referred to as 6× component. Alternately, a polymer layer can be configured to encapsulate only the circuit side 17 and the back side 18 of the substrate 12, such that a 2× component would be provided. U.S. Pat. No. 6,908,784, which is incorporated herein by reference, discloses different configurations of encapsulated semiconductor components.

Referring to FIG. 15A-15D, essentially the same film assisted molding process shown in FIGS. 11A-11D and 12A-

12C, can be used to fabricate any of the previously described through wire interconnects in which the polymer layer which encapsulates the component, also fills the via in place of the polymer material. For illustrative purposes fabrication of the semiconductor component 14-11 of FIG. 2K is illustrated.

Figure 15A:
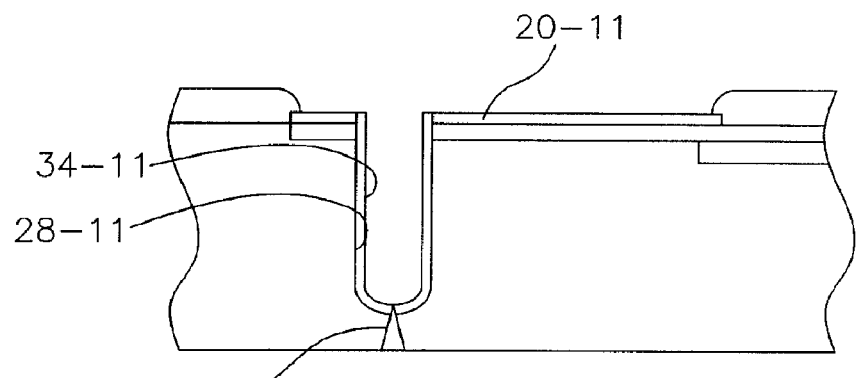
FIGS. 15A-15D are schematic cross sectional views showing steps in a method for fabricating the alternate embodiment semiconductor component of FIG. 2K.
Figure 15B:
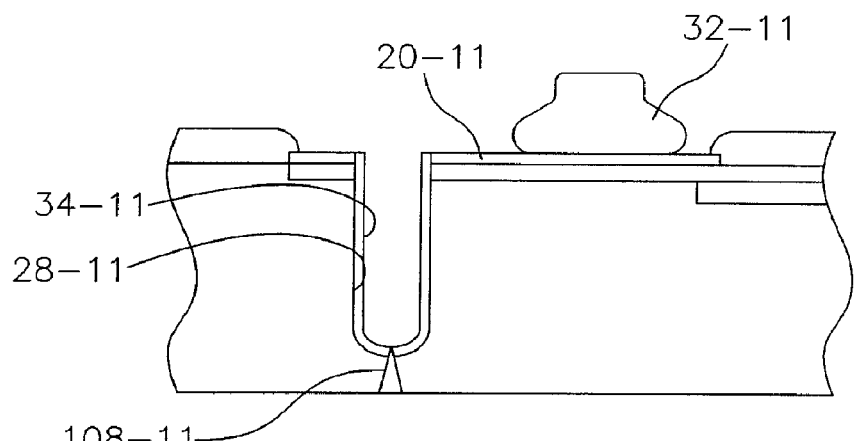

Initially, as shown in FIG. 15A, the via 28-11 and the insulating layer 34-11 are formed in the substrate contact 20-11 substantially as previously described for FIG. 13A. In addition, a vent 108-11 to the via 28-11 is formed. Next as shown in FIG. 15B, the bonding member 32-11 is formed on the substrate contact 20-11. The bonding member 32-11 can comprise a stud bump, or a ball bump, bonded to the substrate contact 20-11 using a wire bonder, a stud bumper, or a ball bumper. Alternately, the bonding member 32-11 can comprise a solder bump, a welded connection, or a conductive polymer connection.

Figure 15C:
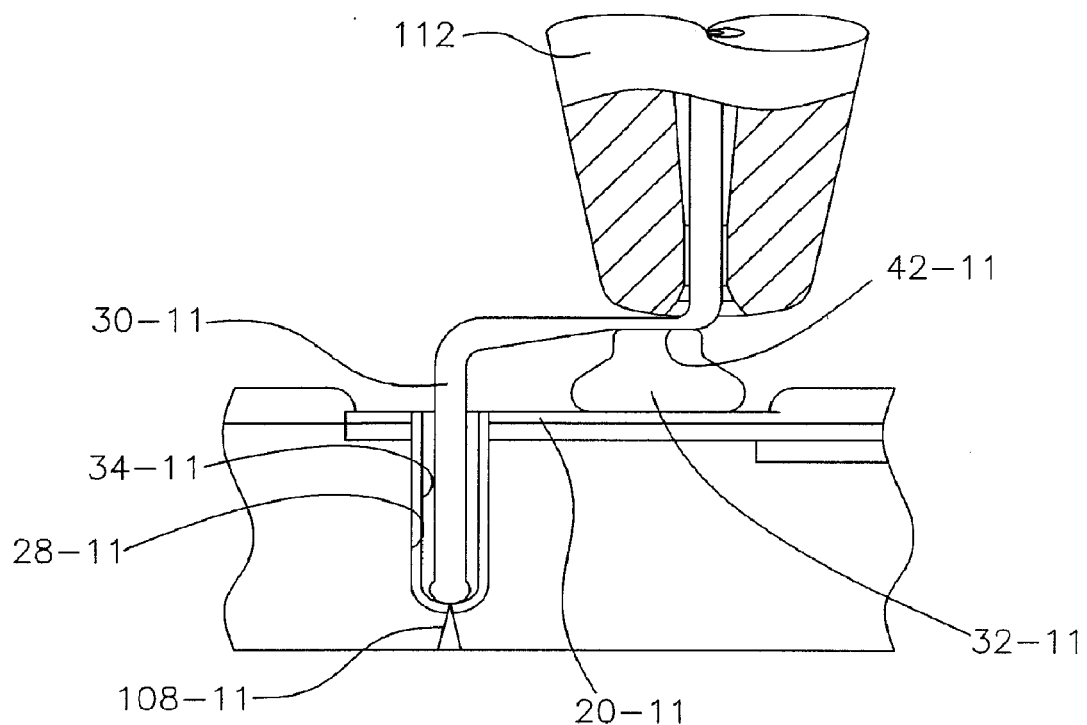

Next, as shown in FIG. 15C, a bonding capillary 112 is used to place the wire 30-11 in the via 28-11, and to form the bonded connection 42-11 between the wire 30-11 and the bonding member 32-11. The wire 30-11 can touch the via 28-11 as shown or can be suspended in the via 28-11.

Figure 15D:
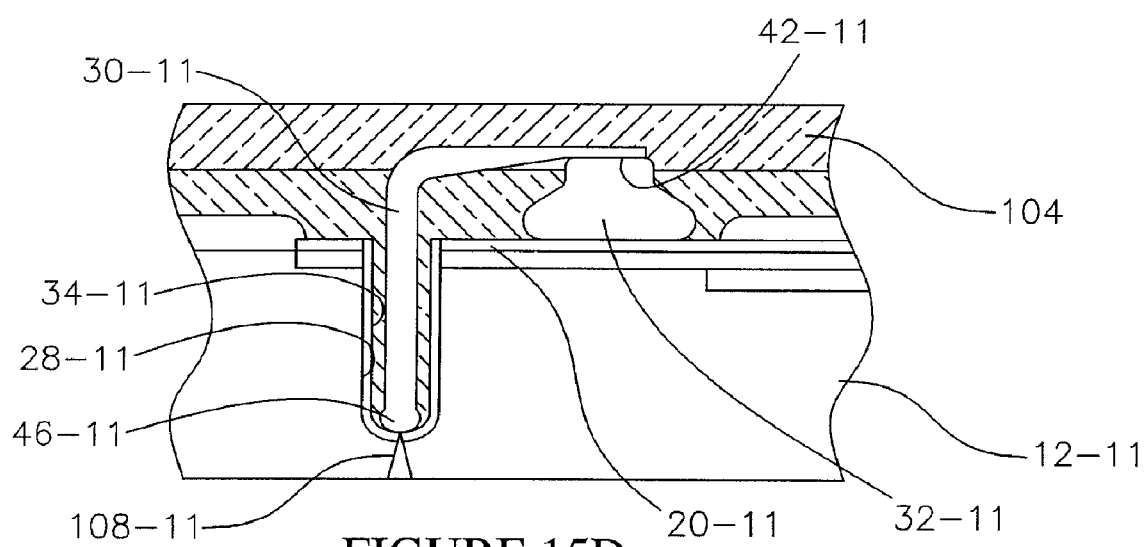

Next, as shown in FIG. 15D, a film assisted molding process is performed substantially as shown in FIGS. 11A-11D and 12A-12C to form the polymer layer 16-11. During the molding process, the mold film 104 protects portions of the wire 30-11 and the bonding member 32-11, so that they remain unencapsulated as previously described. In addition, the mold compound flows into the via 28-11 to fill the via 28-11 and secure the wire 30-11. Although the wire 30-11 may be pushed during molding, and some buckling can occur, this can be tolerated as long as shorting to other elements by the wire 30-11, and removal of the insulating layer 34-11 does not occur. During the molding process, the vent 108-11 allows air to escape from the via 28-11 and the molding compound to flow freely into the via 28-11. A vacuum can also be applied to the vent 108-11 to facilitate filling of the via 28-11 by the mold compound. During the molding process, the vent 108-11 can also function to center the wire 30-11 in the via 28-11. In addition, the molding process can be performed to prevent the molding compound from flowing through the vent 108-11 onto the back side of the substrate 12-11. However, for some applications the vent 108-11 may not be required, such as when a vacuum is pulled on the mold cavities 102 (FIG. 11B). Following the molding process, the mold film 104 can be removed, and the back side of the substrate 12-11 thinned by etching or grinding to expose the ball contact 46-11.

Figure 16A:
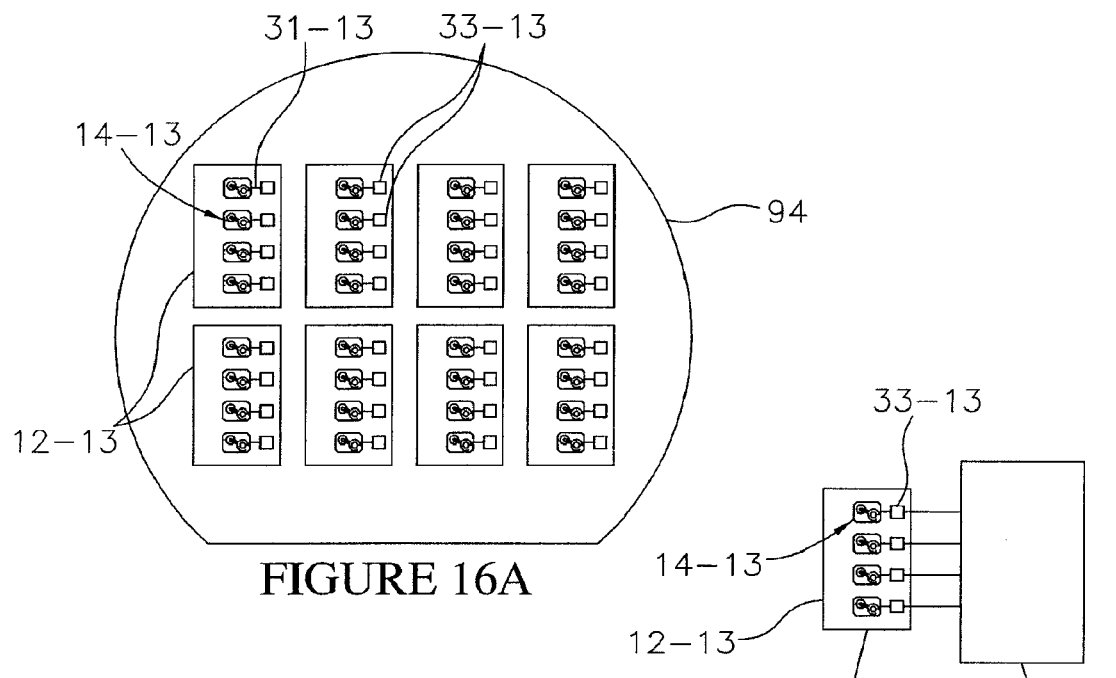
FIGS. 16A-16C are schematic views showing steps in a method for fabricating an embodiment semiconductor component using a film frame.
Figure 16B:
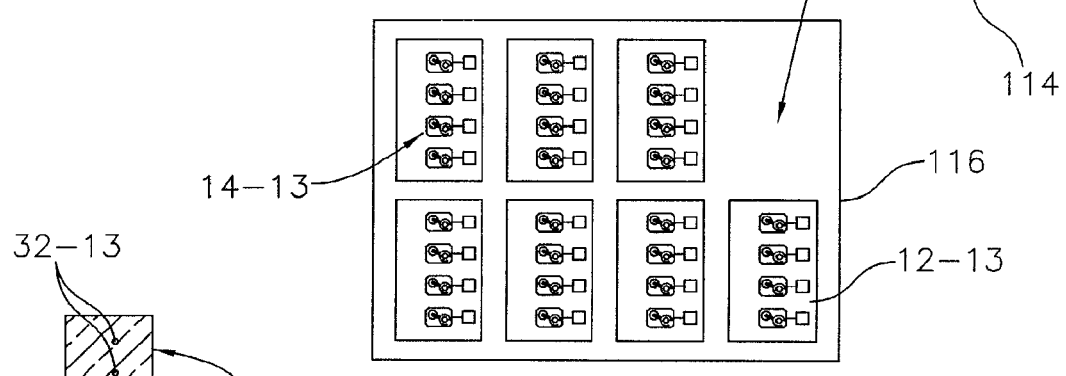
Figure 16C:
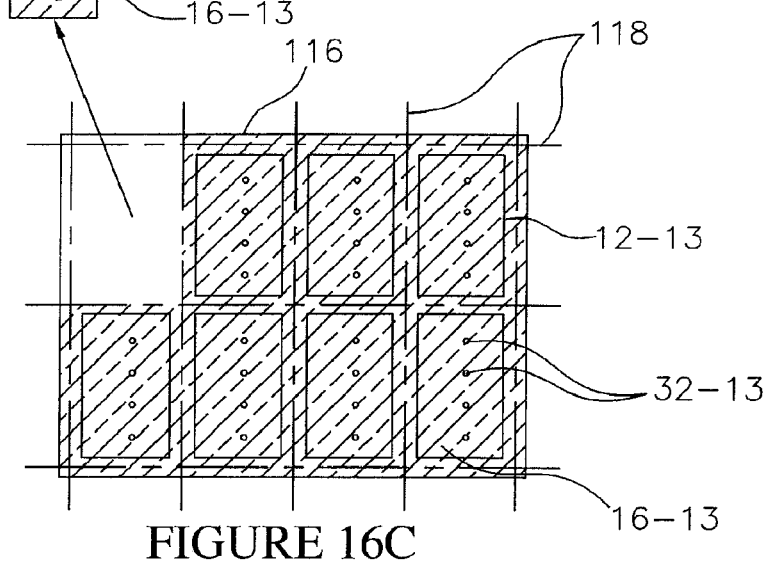

Referring to FIGS. 16A-16C, a method for fabricating a semiconductor component 10-13 (FIG. 16C) is illustrated using a film frame molding process to form the polymer layer 16-13 (FIG. 16C) for the semiconductor component 10-13 (FIG. 16C). Initially, as shown in FIG. 16A, a plurality of semiconductor substrates 12-13 are provided on a component substrate 94, such as a semiconductor wafer, substantially as previously described and shown in FIG. 12A. In addition, through wire interconnects 14-13 are formed on the semiconductor substrates 12-13, substantially as previously described and shown in FIG. 12A. The through wire interconnects 14-13 also include conductors 31-13 and pads 33-13, substantially as previously described and shown in FIG. 2M.

As shown in FIG. 16B, following fabrication of the through wire interconnects 14-13, the component substrate 94 is singulated into separate semiconductor substrates 12-13. The singulation step can be performed using a suitable process such as saw cutting, etching or liquid jetting. In addition, following singulation, the semiconductor substrates 12-13 can be tested by placing the pads 33-13 in electrical communication with testing circuitry 114. For example, the semiconductor substrates 12-13 can be placed in a test fixture, substantially as described in U.S. Pat. No. 5,519,332 entitled "Carrier For Testing An Unpackaged Semiconductor Die", which is incorporated herein by reference. Each semiconductor substrate 12-13 can thus be certified as a known good die (KGD). Alternately, the testing can be performed at the wafer level on the semiconductor substrates 12-13 while they are still contained on the component substrate 94. In this case, the pads 33-13 provide electrical connection points for a probe card or other wafer level test device.

As also shown in FIG. 16B, the singulated and tested semiconductor substrates 12-13 can be placed on a film frame 116. The film frame 116 can comprise a conventional film frame used in the semiconductor industry. In addition, a conventional pick and place process can be used to place the semiconductor substrates 12-13 on the film frame 116.

Next, as shown in FIG. 16C, a film assisted molding process, substantially as previously described and shown in FIGS. 11A-11D, can be performed to form the polymer layer 16-13 for the semiconductor component 10-13. However, in this case the semiconductor substrates 12-13 are contained on the film frame 116 during the film assisted molding process. As previously described, the tip portions of the bonding members 32-13 of the through wire interconnects 14-13 are protected by a mold film 104 (FIG. 11B) and remain unencapsulated during the film assisted molding process. As also shown in FIG. 16C, following the film assisted molding process the semiconductor components 10-13 are singulated by cutting through the polymer material between adjacent semiconductor substrates 12-13 on the film frame 116. In FIG. 16C, the saw cuts are indicated by cut lines 118. With this process the polymer layer 16-13 covers the circuit side and four edges of the semiconductor substrates 12-13, such that the completed semiconductor components 10-13 have a 5× configuration.

In an illustrative embodiment a semiconductor component includes a semiconductor substrate having a first side (circuit side), a second side (back side), and a plurality of integrated circuits. The semiconductor component also includes a plurality of substrate contacts on the first side, a plurality of through wire interconnects (TWI) bonded to the substrate contacts, and a polymer layer on the first side encapsulating at least portions of the through wire interconnects.

Each through wire interconnect (TWI) includes a via through a substrate contact and through the substrate to the second side, a wire in the via bonded to the substrate contact, a first contact on the wire proximate to the first side, and a second contact on the wire proximate to the second side. In the illustrative embodiment the first contact comprises a tip portion of the bonding member on the substrate contact encapsulated by the polymer layer, and the second contact comprises an exposed end of the wire.

The semiconductor component can also include a polymer member on the substrate contact which supports and maintains a planarity of a loop portion of the wire. In addition, the loop portion of the wire can be configured as a third contact with the polymer member providing a force for making a connection with a mating contact on a device under test or a next level substrate. The contacts on the wire can also include outer layers configured to provide abrasion resistance, and enhanced penetration of oxide or contaminants on the mating contact.

The semiconductor component can be used as a stand alone device, or in combination with other semiconductor components to fabricate semiconductor systems. The semiconductor systems can include singulated components bonded to one another (singulated system), or singulated semiconductor components bonded to a semiconductor wafer (wafer system), or semiconductor components contained on a semiconductor wafer bonded to another semiconductor wafer (wafer to wafer system). With each system, the through wire interconnects (TWI) provide a signal transmission system, and bonding structures between adjacent stacked components and next level substrates as well. The semiconductor component can also be used to fabricate test systems with the through wire interconnects (TWI) functioning as contact structures for making temporary and/or permanent electrical connections with a device under test.

The method for fabricating a semiconductor component with through wire interconnects (TWI) includes the steps of: providing a semiconductor substrate with substrate contacts, forming vias through the substrate, placing the wires in the vias, bonding the wires to the substrate contacts, forming bonding members on the wires and the substrate contacts, and forming a polymer layer on the first side substantially encapsulating loop portions of the wires and the bonding members. The polymer layer can be formed using a film assisted molding process including the steps of: forming a mold film on tip portions of the bonding members, molding the polymer layer, and then removing the mold film to expose the tip portions of the bonding members.

While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:

1. A method for fabricating a stacked semiconductor system comprising:
   providing a first substrate having a first through wire interconnect and a second substrate having a second through wire interconnect, each through wire interconnect comprising a wire in a via bonded to a substrate contact, a first contact and a second contact on the wire, and a polymer layer at least partially encapsulating the wire while leaving the first contact exposed; and
   stacking the first substrate on the second substrate with the first through wire interconnect on the first substrate electrically connected to the second through wire interconnect on the second substrate.

2. The method of claim 1 wherein the stacking step comprises bonding the first contact on the first substrate to the second contact on the second substrate.

3. The method of claim 1 wherein the stacking step comprises bonding the first contact on the first substrate to the first contact on the second substrate.

4. The method of claim 1 wherein the first contact comprises a bonding member and the second contact comprises an end of the wire bonded to the bonding member.

5. The method of claim 1 wherein the first contact comprises a first bonding member and the second contact comprises a second bonding member bonded to the first bonding member.

6. The method of claim 1 wherein the first substrate and the second substrate comprise thinned semiconductor dice or thinned semiconductor wafers.

7. A method for fabricating a stacked semiconductor system comprising:
   providing a first substrate having a first side, a second side, a substrate contact on the first side, and a via extending through the substrate contact and the substrate from the first side to the second side;
   forming a through wire interconnect on the first substrate comprising a wire in the via bonded to the substrate contact, a first contact on the wire proximate to the first side, a second contact on the wire proximate to the second side, and a polymer layer on the first side at least partially encapsulating the wire while leaving the first contact exposed; and
   stacking at least one second substrate on the first substrate having a second through wire interconnect electrically connected to the first contact or to the second contact.

8. The method of claim 7 wherein the forming the through wire interconnect step comprises forming the polymer layer using a film assisted molding process.

9. The method of claim 7 wherein the stacking step comprises forming a conductive polymer film between the first substrate and the second substrate.

10. The method of claim 7 wherein the stacking step comprises stacking the first side of the first substrate to the second side of the second substrate.

11. The method of claim 7 wherein the stacking step comprises stacking the first side of the first substrate to the first side of the second substrate.

12. The method of claim 7 wherein the first contact comprises a bonding member on the wire and the second contact comprises an end of the wire.

13. The method of claim 7 wherein the first substrate and the second substrate comprise thinned semiconductor dice or thinned semiconductor wafers.

14. A method for fabricating a stacked semiconductor system comprising:
   providing a first substrate and a second substrate;
   forming a first through wire interconnect on the first substrate and a second through wire interconnect on the second substrate, each through wire interconnect comprising a wire in a via bonded to a substrate contact, a first contact on the wire proximate to a first side, a second contact on the wire proximate to a second side, and a polymer layer on the first side at least partially encapsulating the wire while leaving the first contact exposed; and
   stacking the first substrate on the second substrate with the first through wire interconnect on the first substrate electrically connected to the second through wire interconnect on the second substrate.

15. The method of claim 14 wherein the stacking step comprises stacking the first side of the first substrate to the second side of the second substrate.

16. The method of claim 14 wherein the stacking step comprises stacking the first side of the first substrate to the first side of the second substrate.

17. The method of claim 14 wherein the stacking step comprises bonding the first contact on the first substrate to the second contact on the second substrate.

18. The method of claim 14 wherein the stacking step comprises bonding the first contact on the first substrate to the first contact on the second substrate.

19. The method of claim 14 wherein the first contact comprises a bonding member and the second contact comprises an end of the wire bonded to the bonding member.

20. The method of claim 14 wherein the first substrate and the second substrate comprise thinned semiconductor dice or thinned semiconductor wafers.

* * * * *

UNITED STATES PATENT AND TRADEMARK OFFICE
CERTIFICATE OF CORRECTION

PATENT NO.        : 8,404,523 B2
APPLICATION NO.   : 13/534038
DATED             : March 26, 2013
INVENTOR(S)       : David R. Hembree et al.

It is certified that error appears in the above-identified patent and that said Letters Patent is hereby corrected as shown below:

On the Title Page, Item [73], delete "Technoloy," and insert -- Technology, --, therefor.

In the Specification

In column 1, line 15, delete "Apr. 26, 2006," and insert -- Apr. 24, 2006 --, therefor.

Signed and Sealed this
Twentieth Day of August, 2013

Teresa Stanek Rea
*Acting Director of the United States Patent and Trademark Office*